US012626775B2

(12) United States Patent
Muto et al.

(10) Patent No.: US 12,626,775 B2
(45) Date of Patent: May 12, 2026

(54) MAGNETIC MEMORY AND MEMORY SYSTEM

(71) Applicant: Kioxia Corporation, Tokyo (JP)

(72) Inventors: Shogo Muto, Fujisawa (JP); Masanobu Shirakawa, Chigasaki (JP); Hideki Yamada, Yokohama (JP); Ryo Yamaki, Yokohama (JP); Yoshihiro Ueda, Yokohama (JP); Tsuyoshi Kondo, Kawasaki (JP)

(73) Assignee: Kioxia Corporation, Tokyo (JP)

( * ) Notice: Subject to any disclaimer, the term of this patent is extended or adjusted under 35 U.S.C. 154(b) by 126 days.

(21) Appl. No.: 18/764,581

(22) Filed: Jul. 5, 2024

(65) Prior Publication Data

US 2025/0022498 A1      Jan. 16, 2025

(30) Foreign Application Priority Data

Jul. 10, 2023      (JP) ................................. 2023-112947

(51) Int. Cl.
| | |
|---|---|
| *G11C 19/08* | (2006.01) |
| *G11C 11/16* | (2006.01) |
| *H10B 61/00* | (2023.01) |

(52) U.S. Cl.
CPC ........ *G11C 19/0841* (2013.01); *G11C 11/161* (2013.01); *G11C 11/1659* (2013.01); *G11C 11/1673* (2013.01); *G11C 11/1675* (2013.01); *G11C 19/0833* (2013.01); *H10B 61/00* (2023.02)

(58) Field of Classification Search
CPC .............. G11C 19/0841; G11C 11/161; G11C 11/1659; G11C 11/1673; G11C 11/1675; G11C 19/0833; H10B 61/00; H10N 50/10
See application file for complete search history.

(56) References Cited

U.S. PATENT DOCUMENTS

| | | | | |
|---|---|---|---|---|
| 2007/0198618 A1* | 8/2007 | Kim | ................... | G11C 19/0808 708/130 |
| 2009/0207643 A1 | 8/2009 | Joe et al. | | |
| 2010/0284216 A1* | 11/2010 | Kim | ................... | G11C 11/1659 365/171 |
| 2017/0040046 A1 | 2/2017 | Fu et al. | | |
| 2020/0082863 A1* | 3/2020 | Ueda | ................... | G11C 11/1673 |
| 2020/0294610 A1* | 9/2020 | Takada | ................ | G11C 11/1675 |
| 2021/0089233 A1 | 3/2021 | Ueda et al. | | |
| 2022/0101901 A1 | 3/2022 | Takeda et al. | | |

* cited by examiner

*Primary Examiner* — Jay W. Radke
(74) *Attorney, Agent, or Firm* — Oblon, McClelland, Maier & Neustadt, L.L.P.

(57) ABSTRACT

A first circuit outputs first information indicating presence/absence of a magnetic wall between two adjacent portions among portions of a magnetic body, and outputs second information based on the combination of magnetization states of the two portions. A first storage circuit stores first bits corresponding to the portions, respectively. A most significant bit of the first bits has a value independent of a magnetization state of its corresponding one of the portions, and the first bits have a value based on the first information. A second storage circuit stores the second information. A second circuit causes the first storage circuit to output the first bits when a value of a least significant bit of the first bits matches a value of the second information, and otherwise to output third bits having inverse values of the first bits.

20 Claims, 27 Drawing Sheets

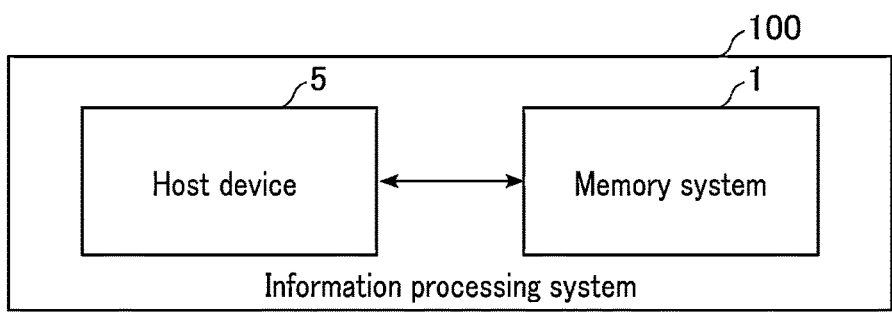
F I G. 1
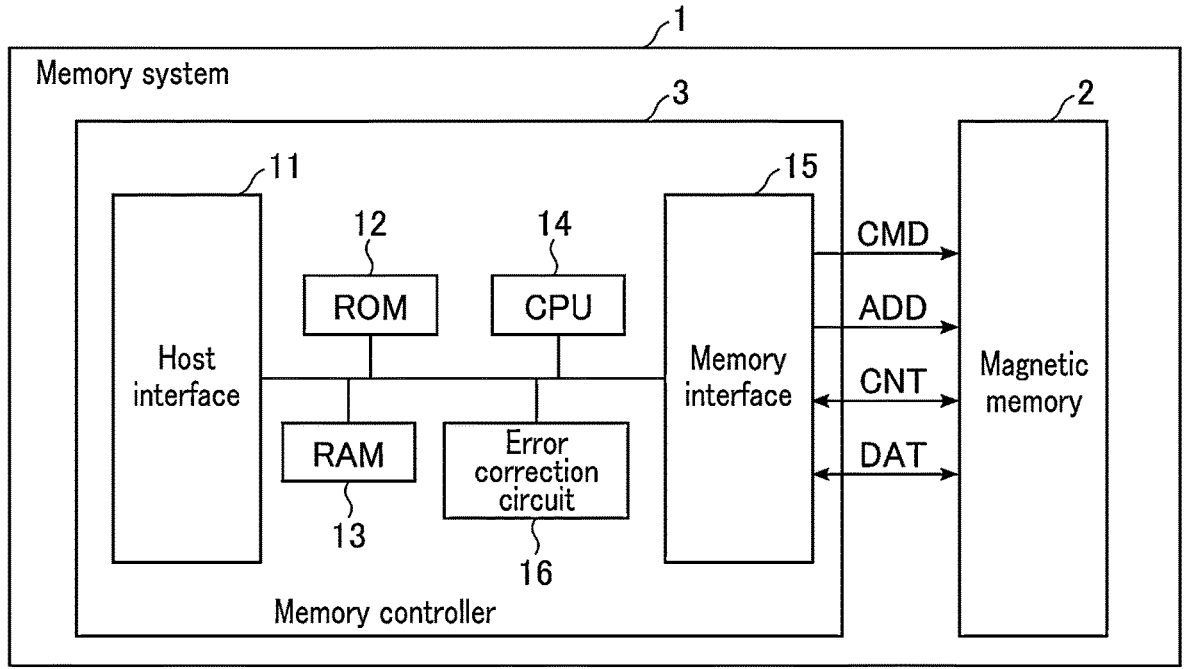
F I G. 2

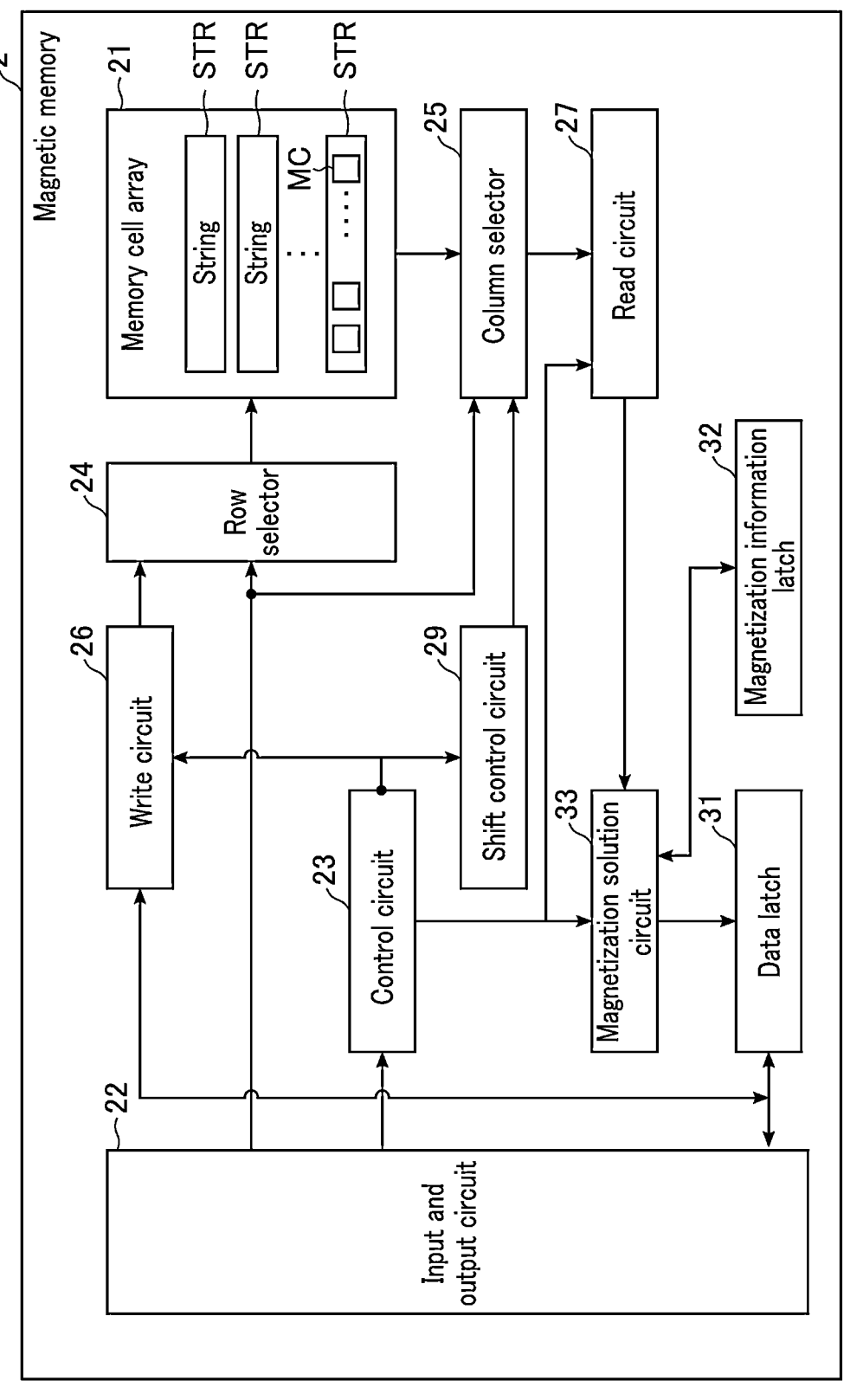
F I G. 3

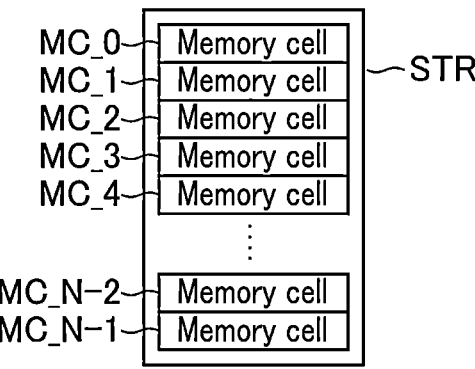
F I G. 4

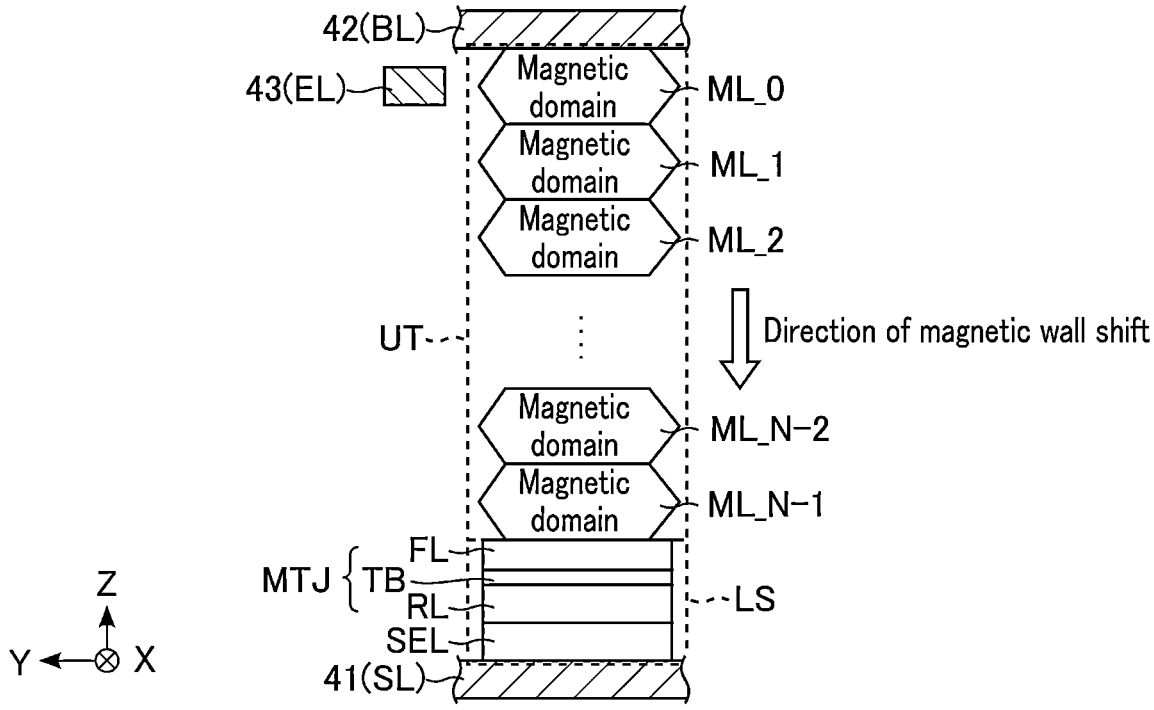
F I G. 6
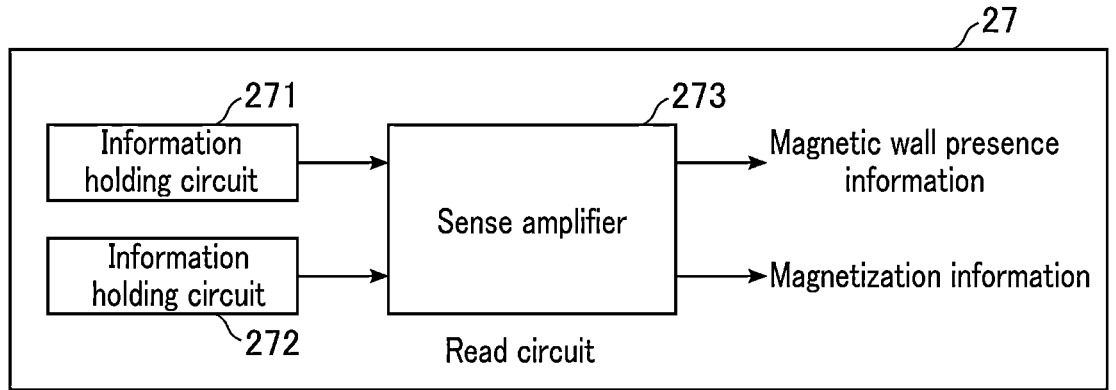
F I G. 7

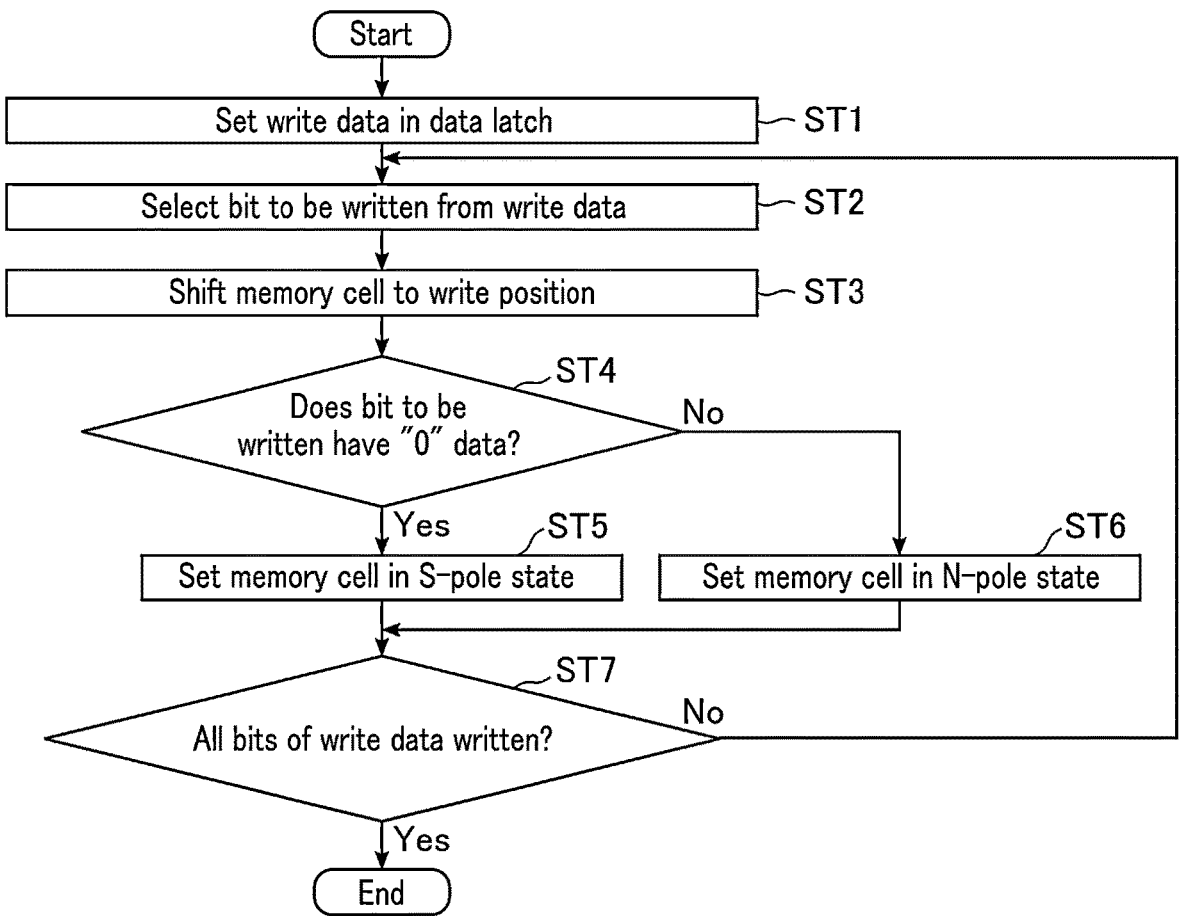
F I G. 8

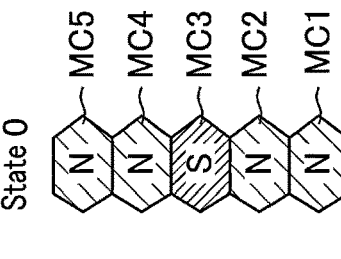
State 0
ML_N−5    ML_N−4    ML_N−3    ML_N−2    ML_N−1
MC5    MC4    MC3    MC2    MC1
Magnetic wall presence information
Provisional read data
Magnetization information latch
Time
F I G. 9

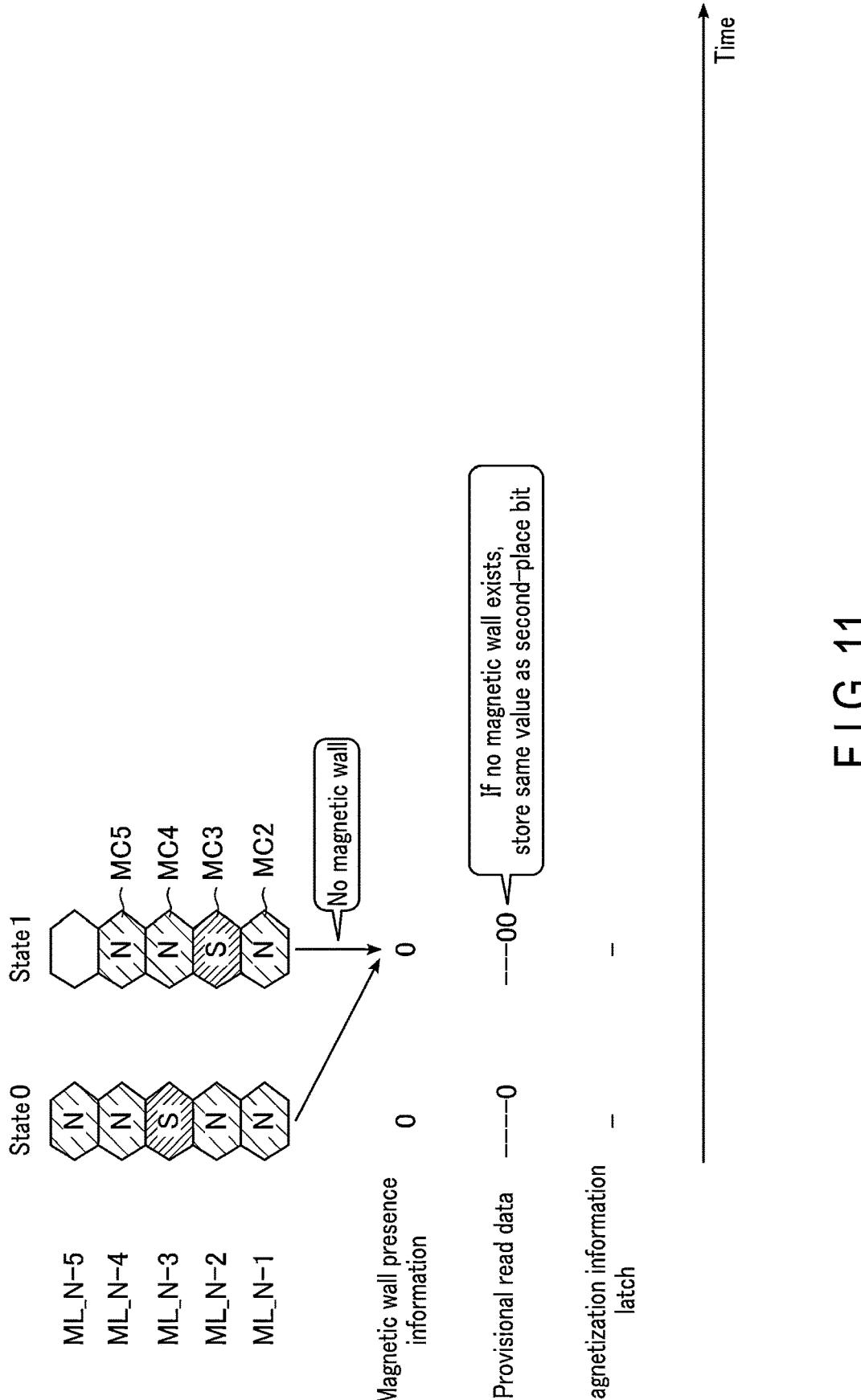
F I G. 11

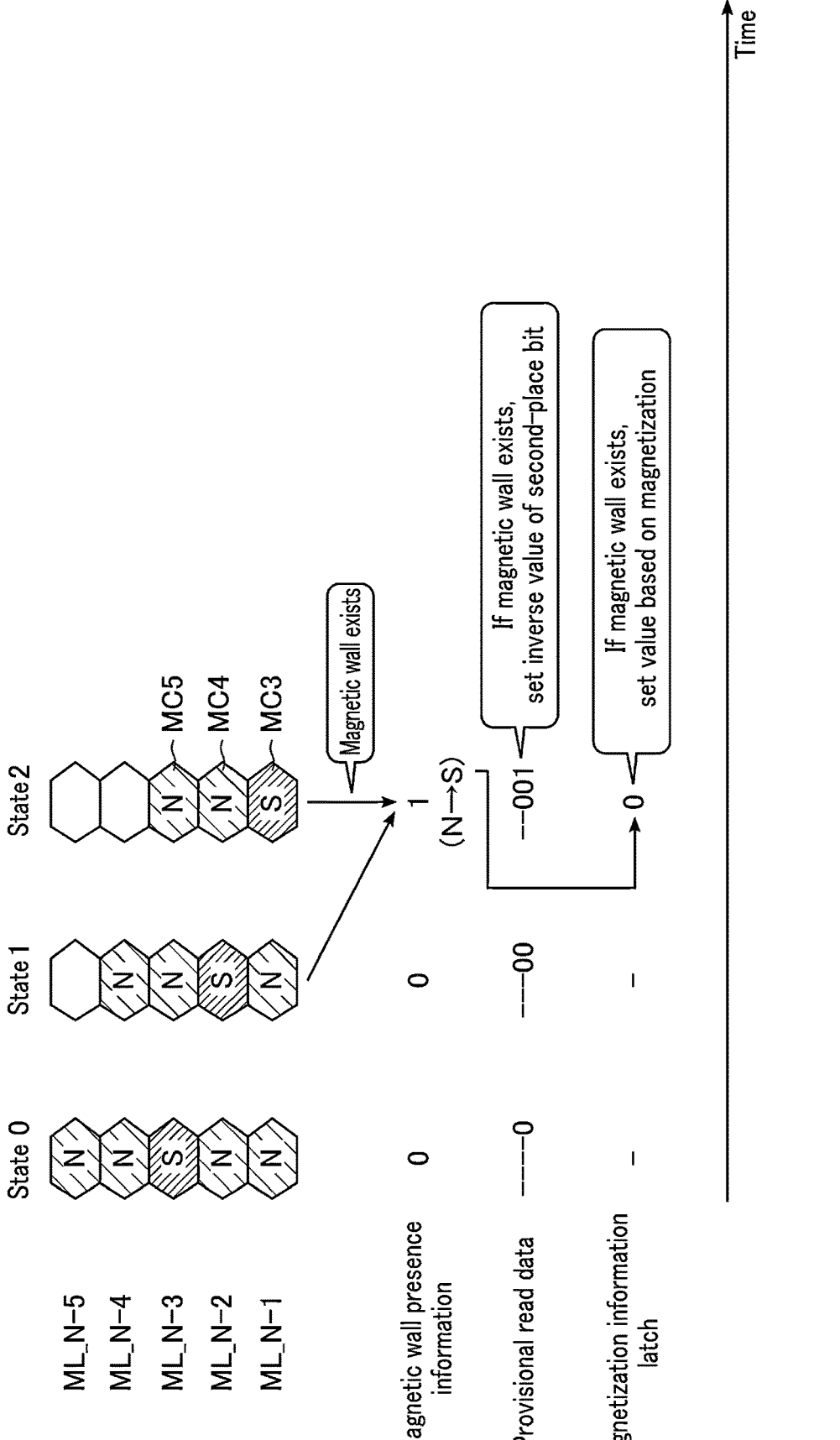
F I G. 12

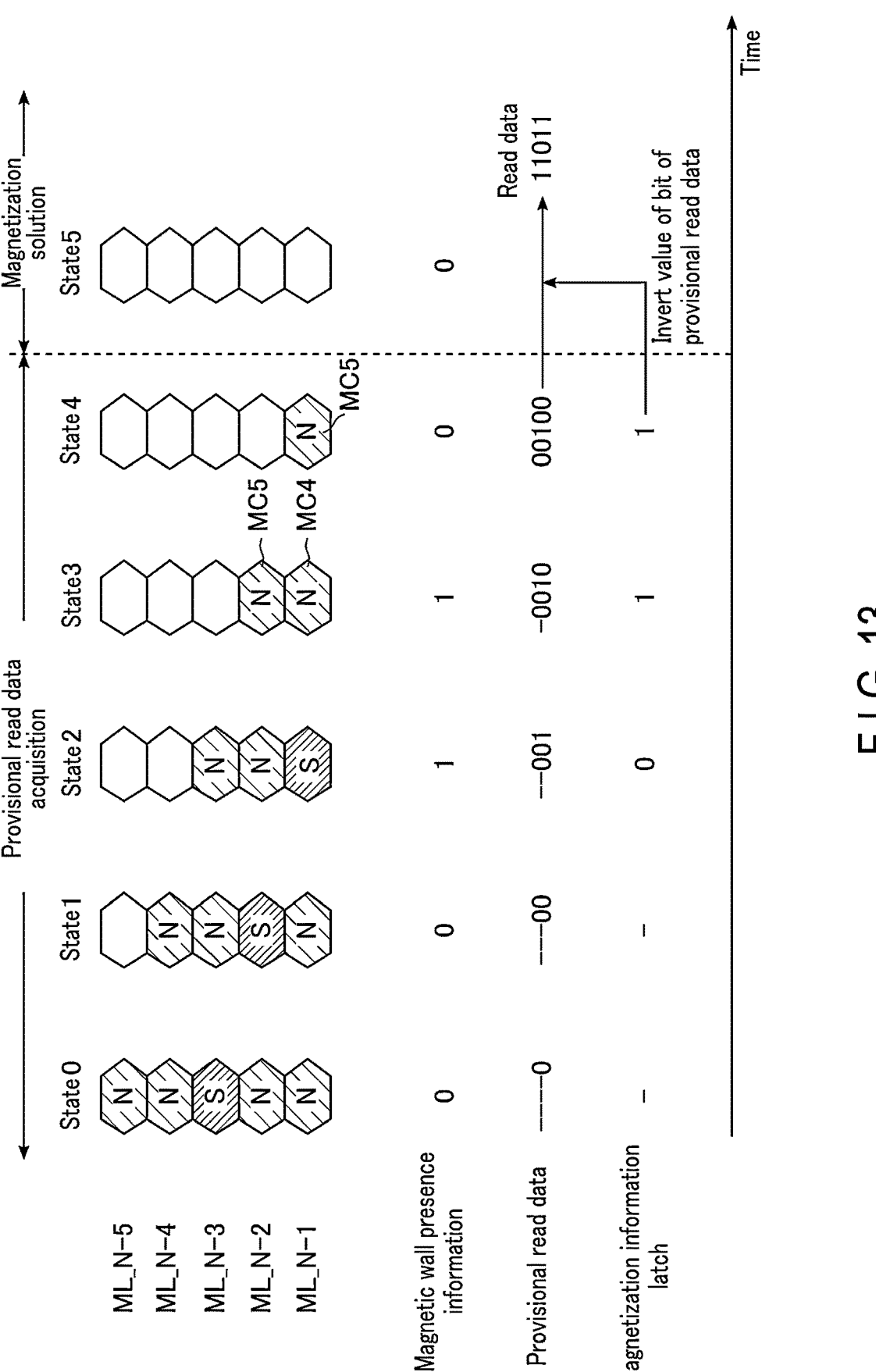
F I G. 13

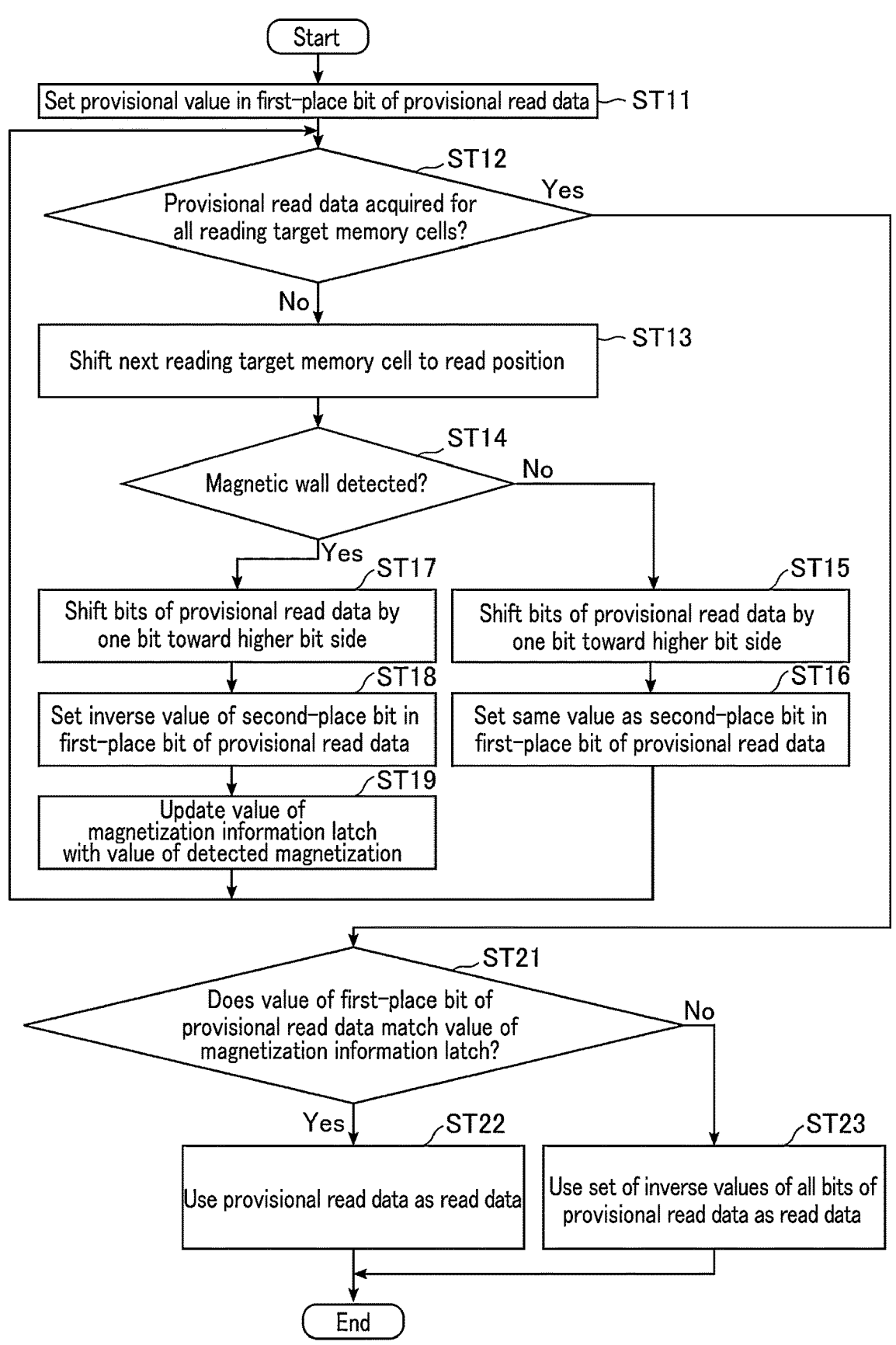
F I G. 15

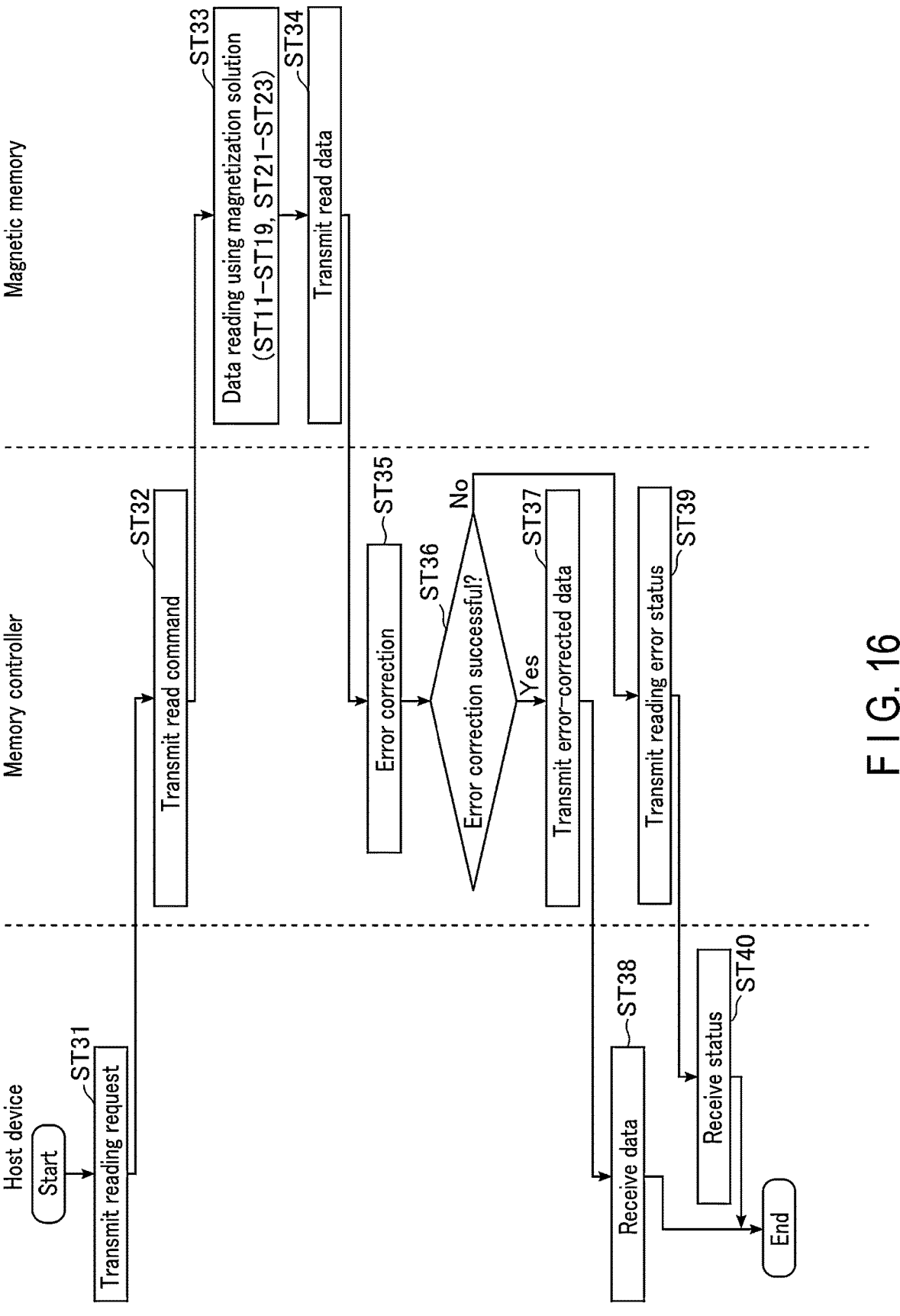
F I G. 16

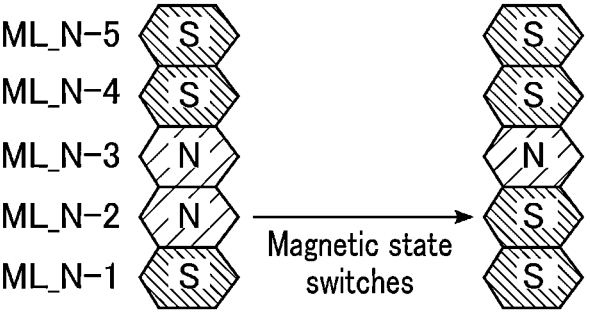
F I G. 17

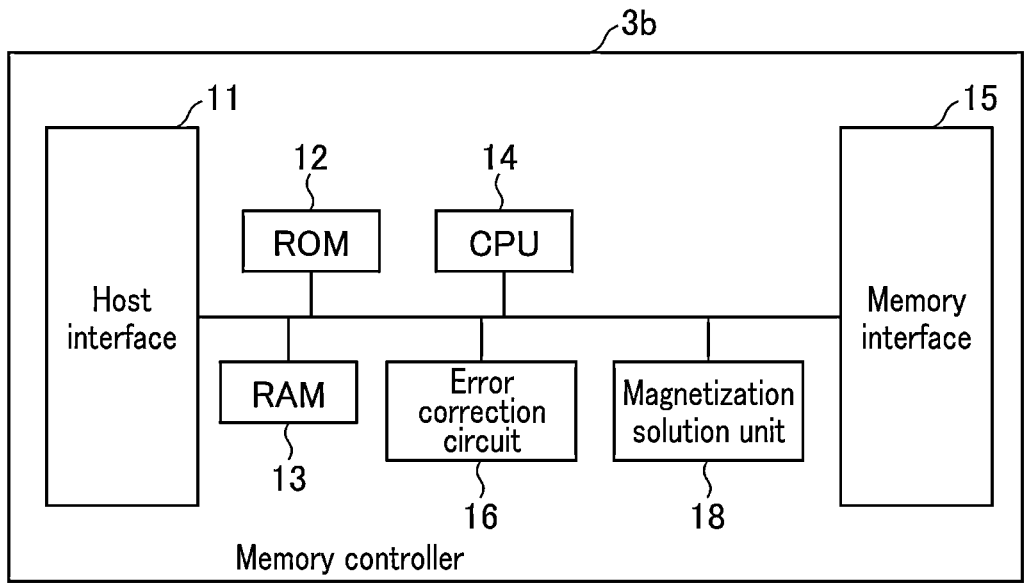
F I G. 18

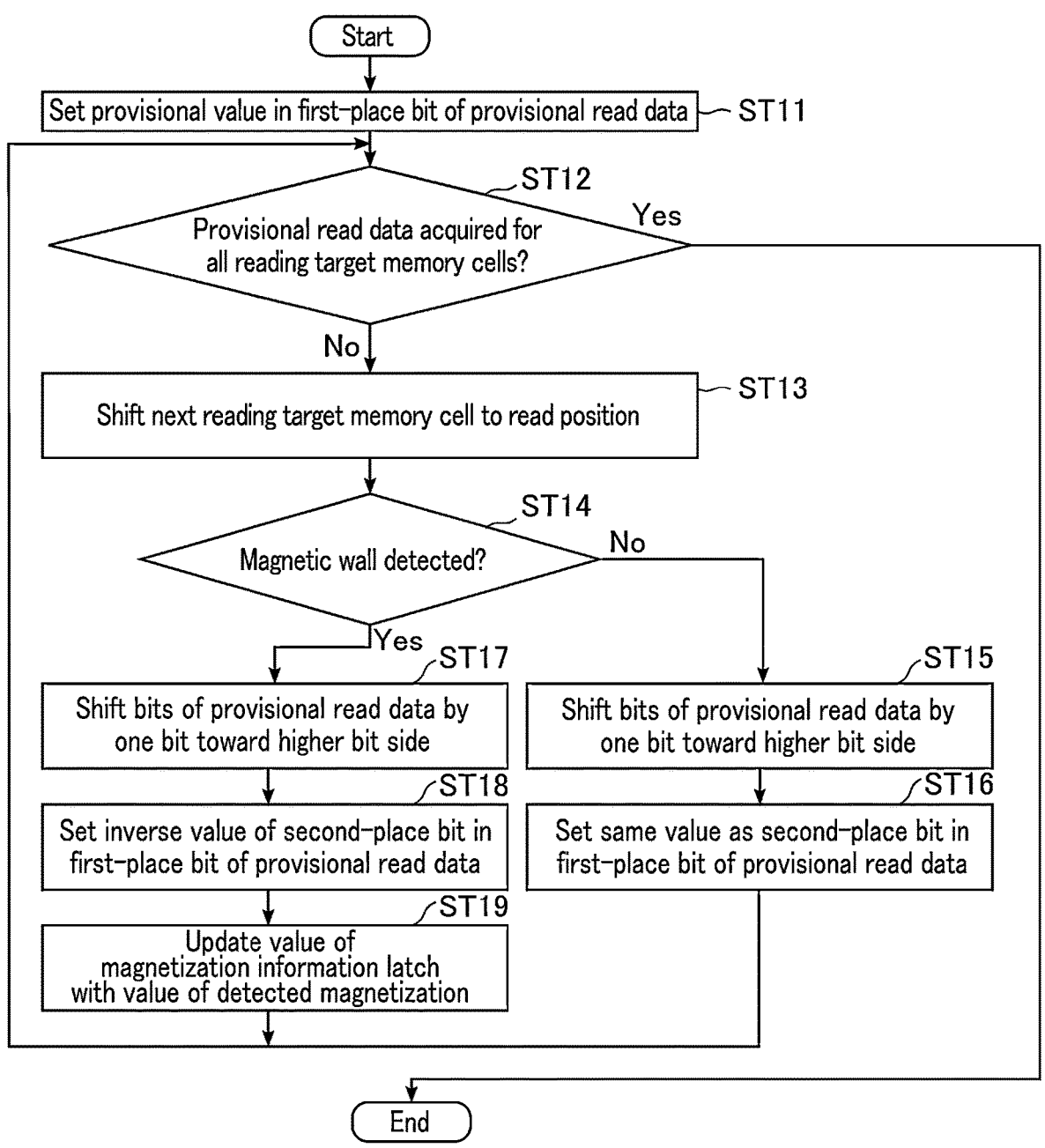
F I G. 19

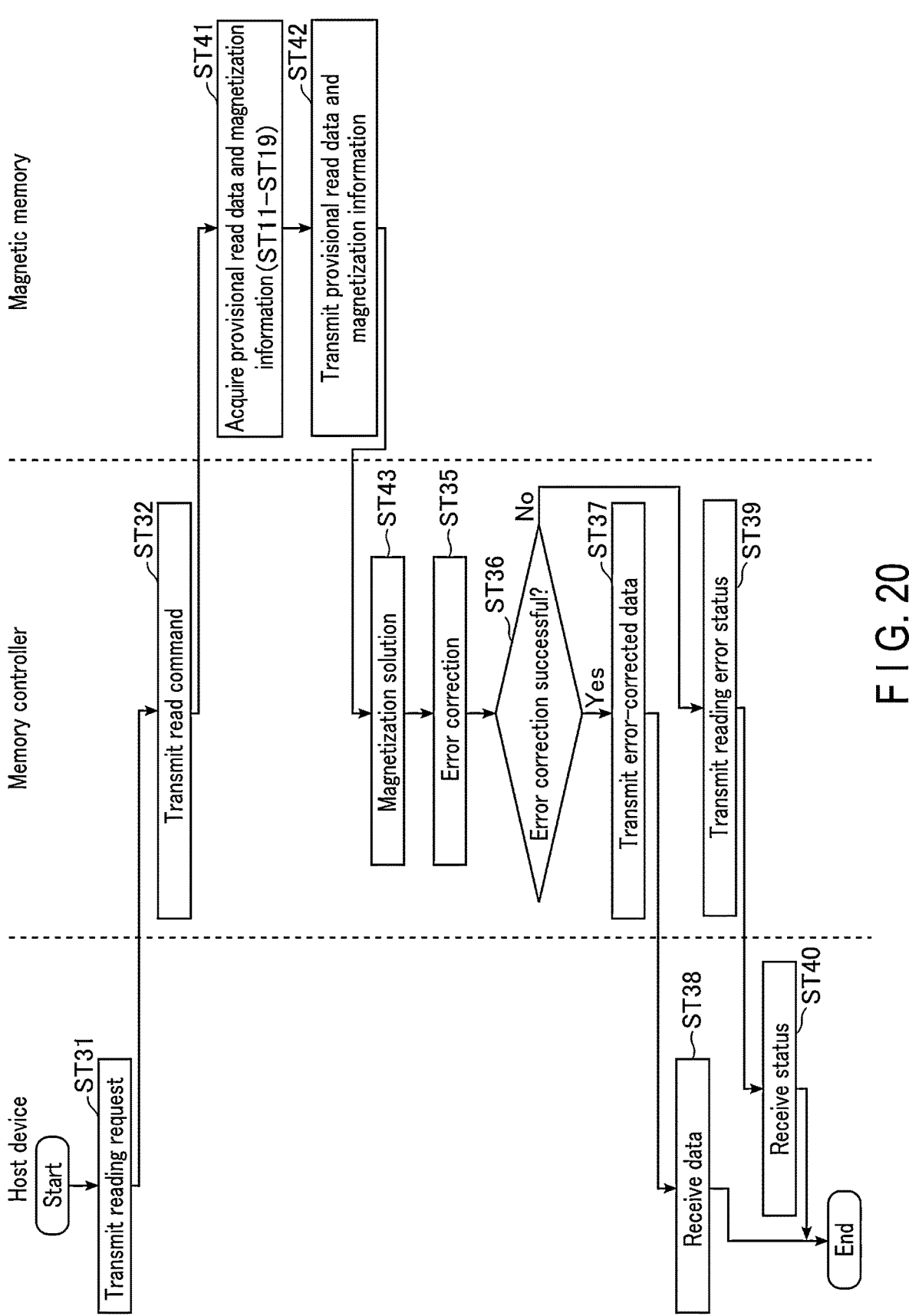
F I G. 20

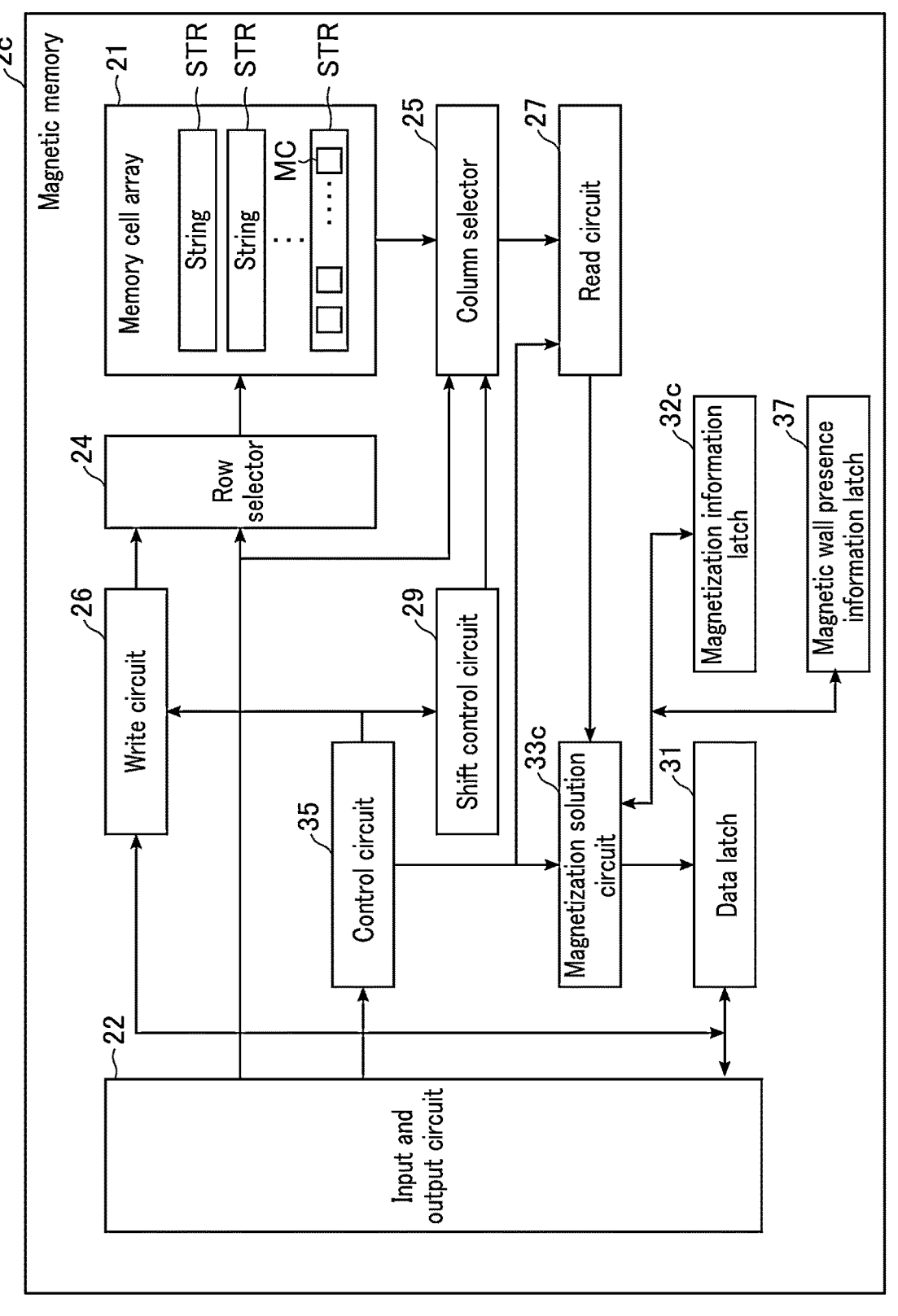
F I G. 21

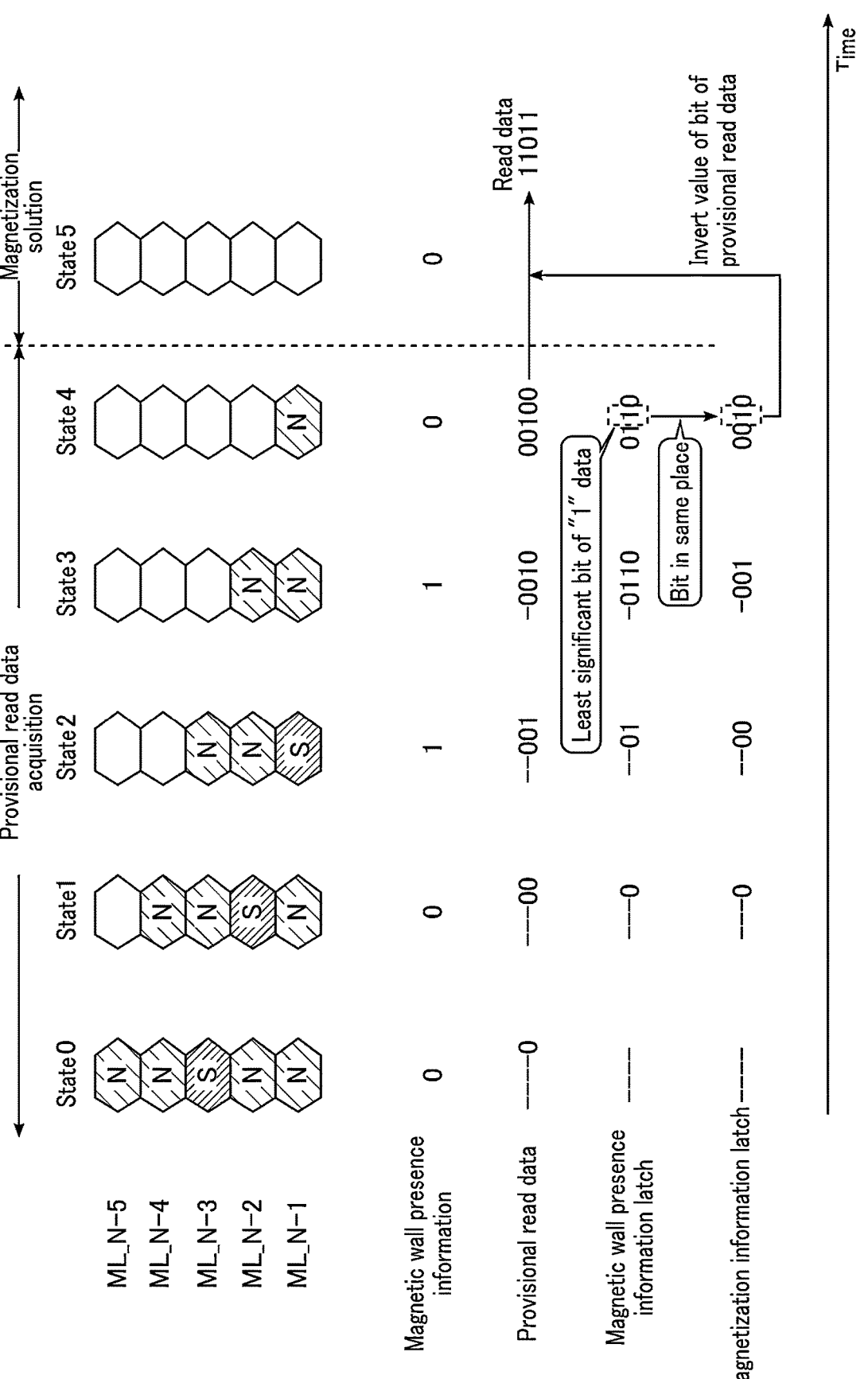
F I G. 22

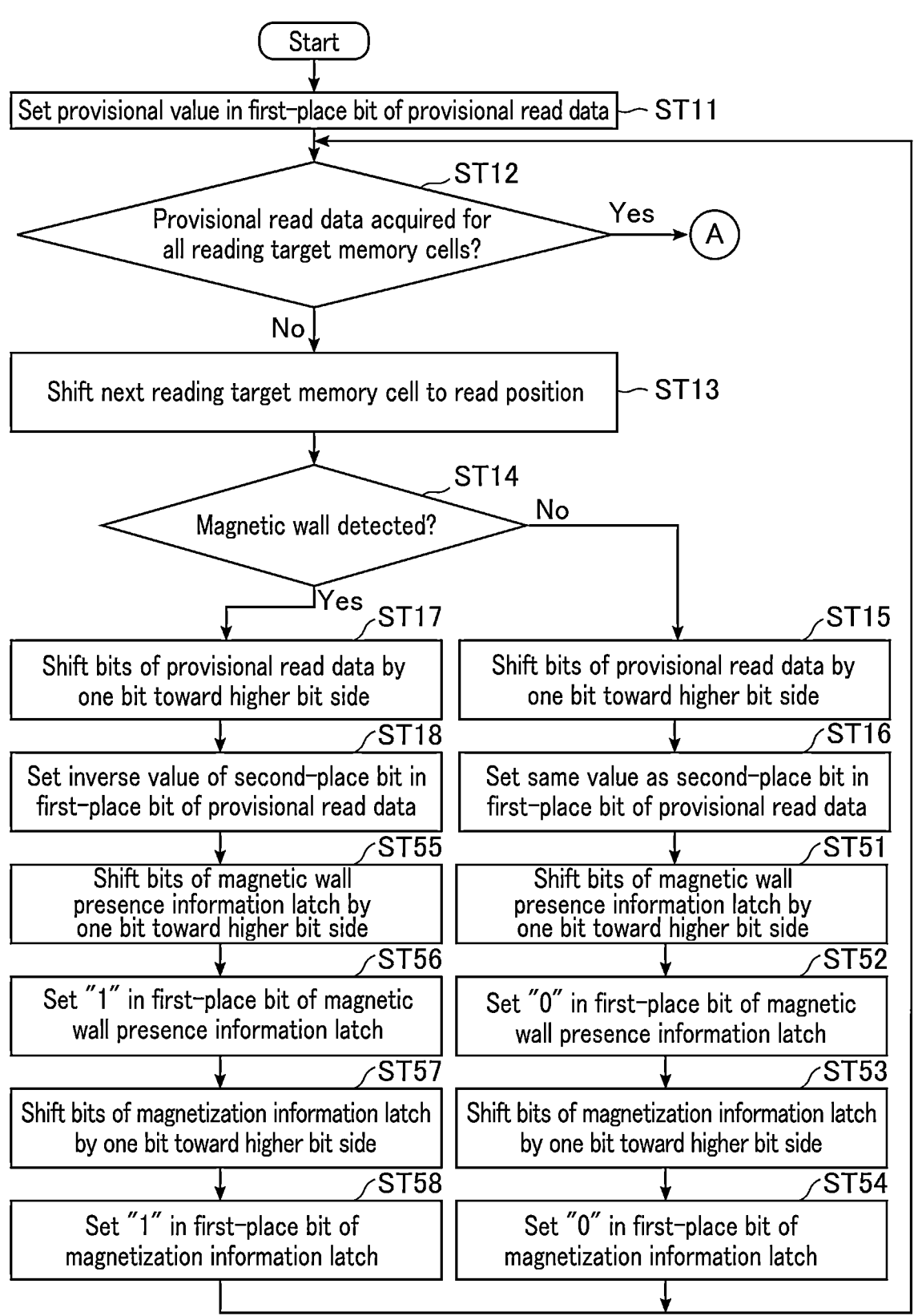
F I G. 23

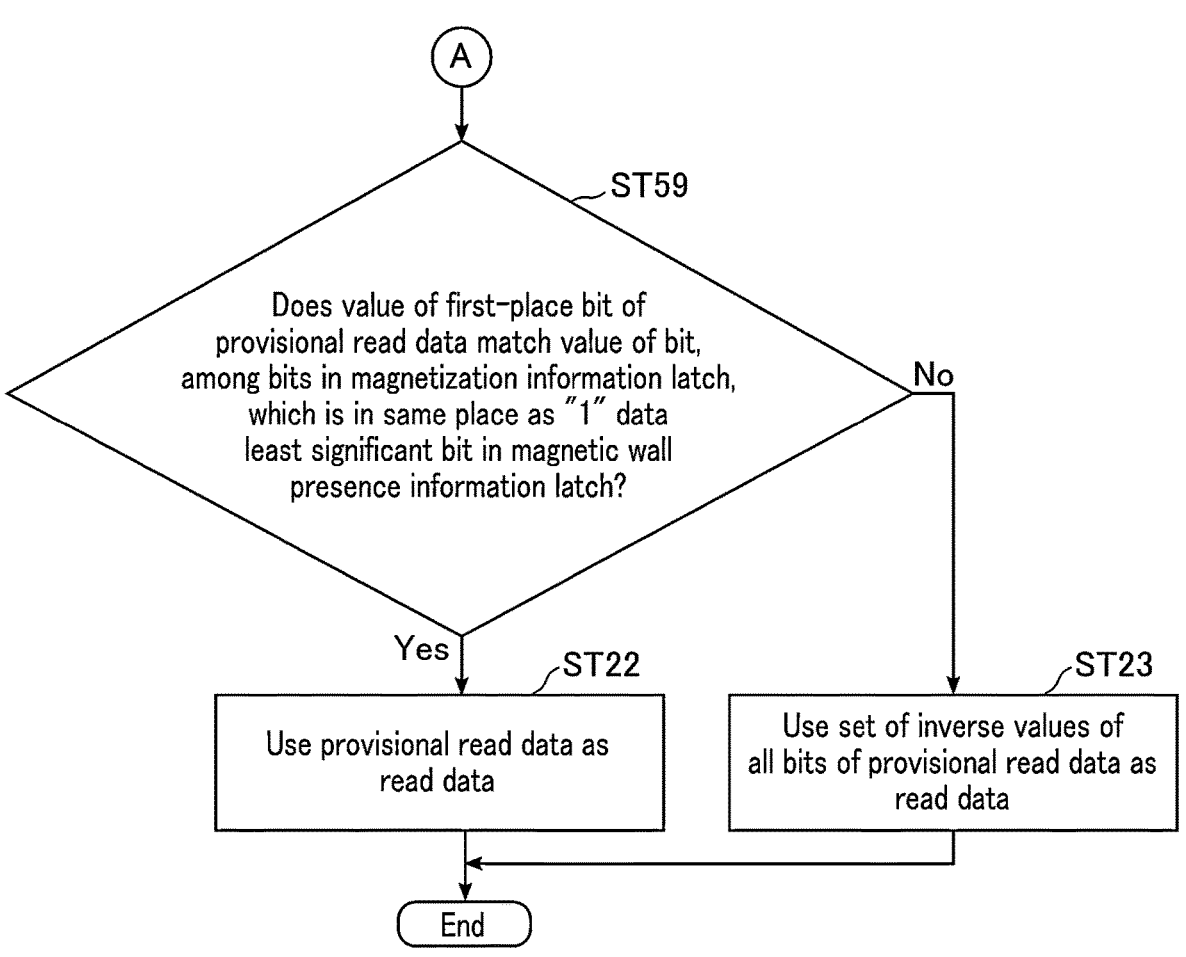
F I G. 24

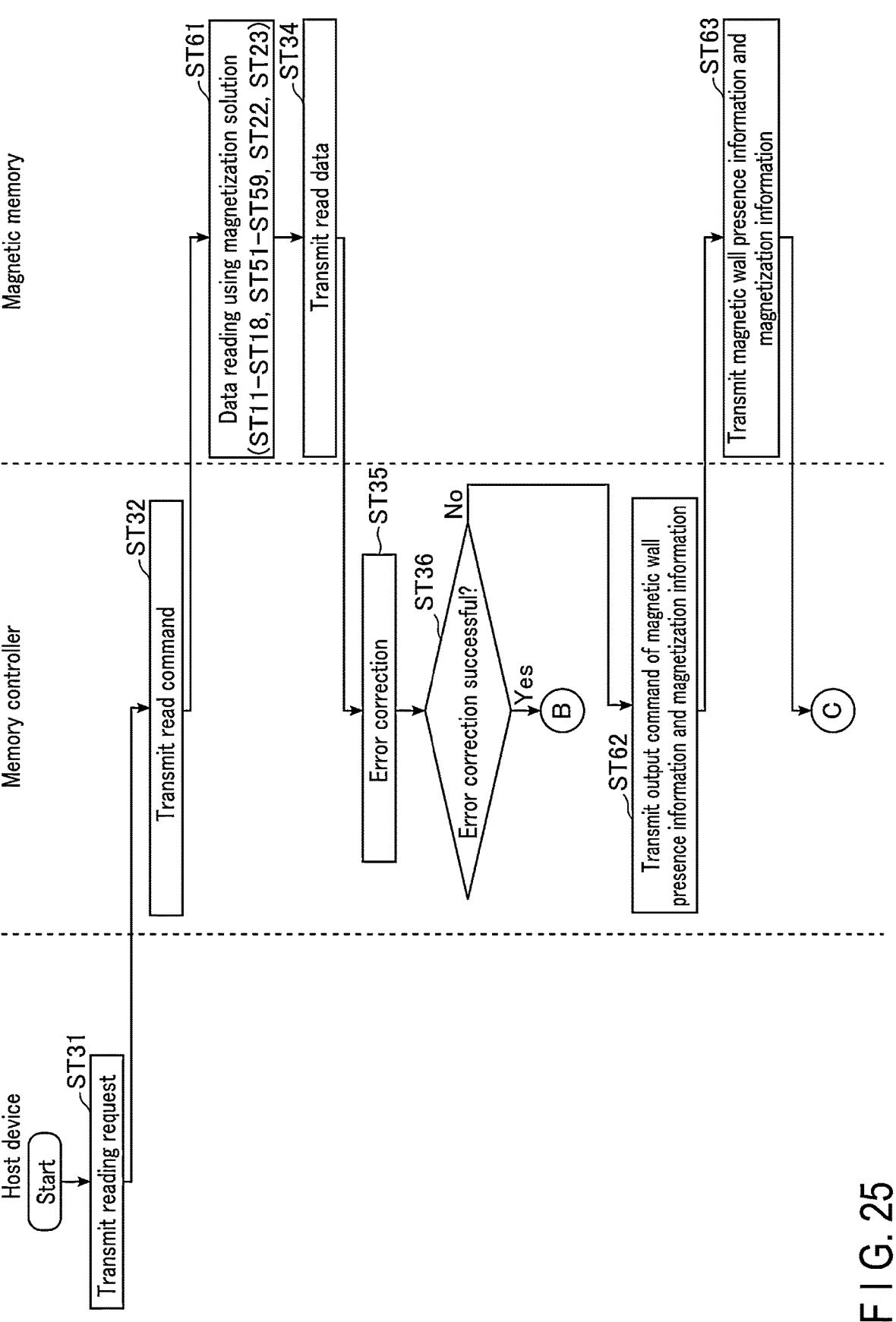
F I G. 25

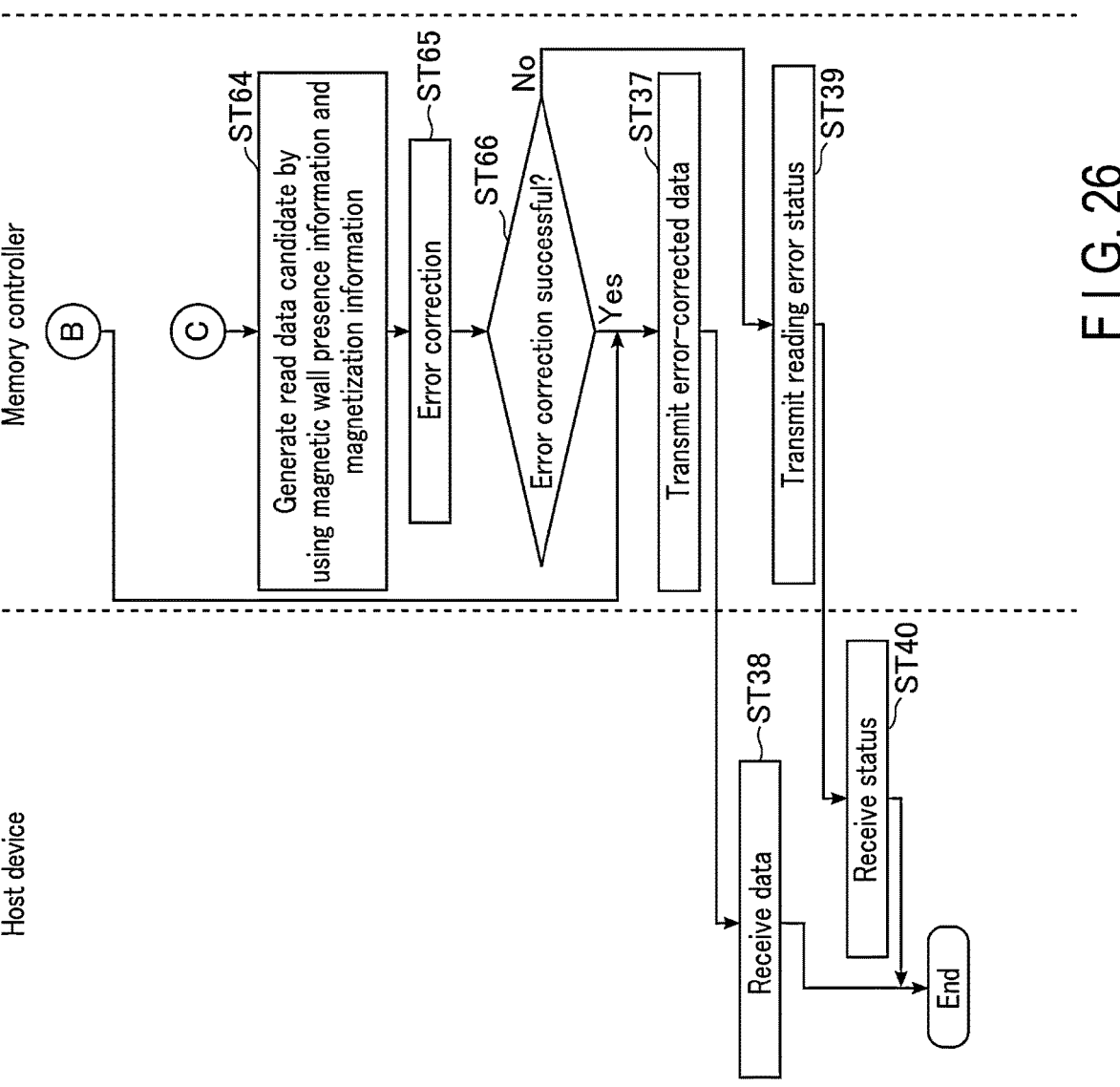
F I G. 26

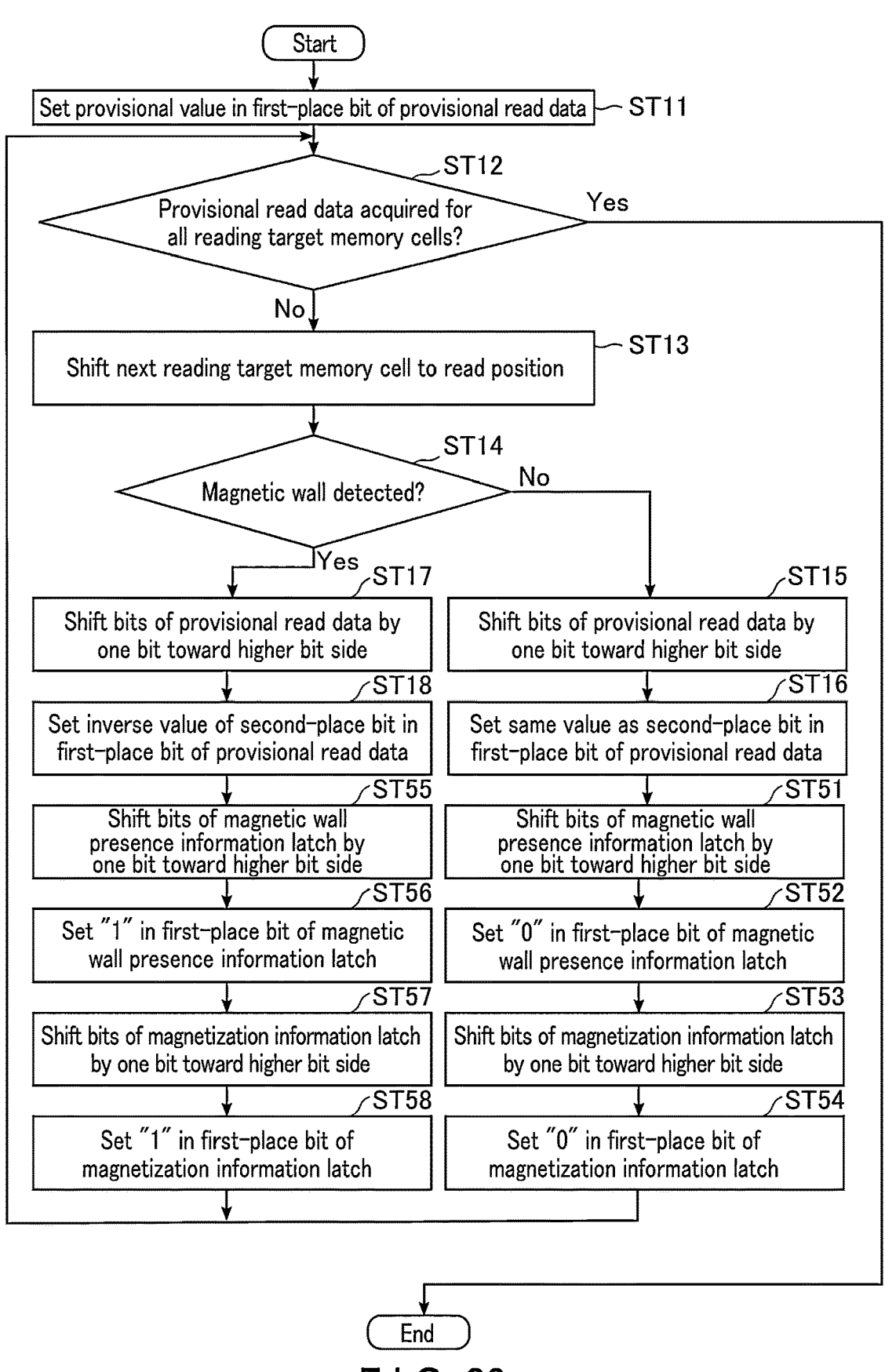
F I G. 28

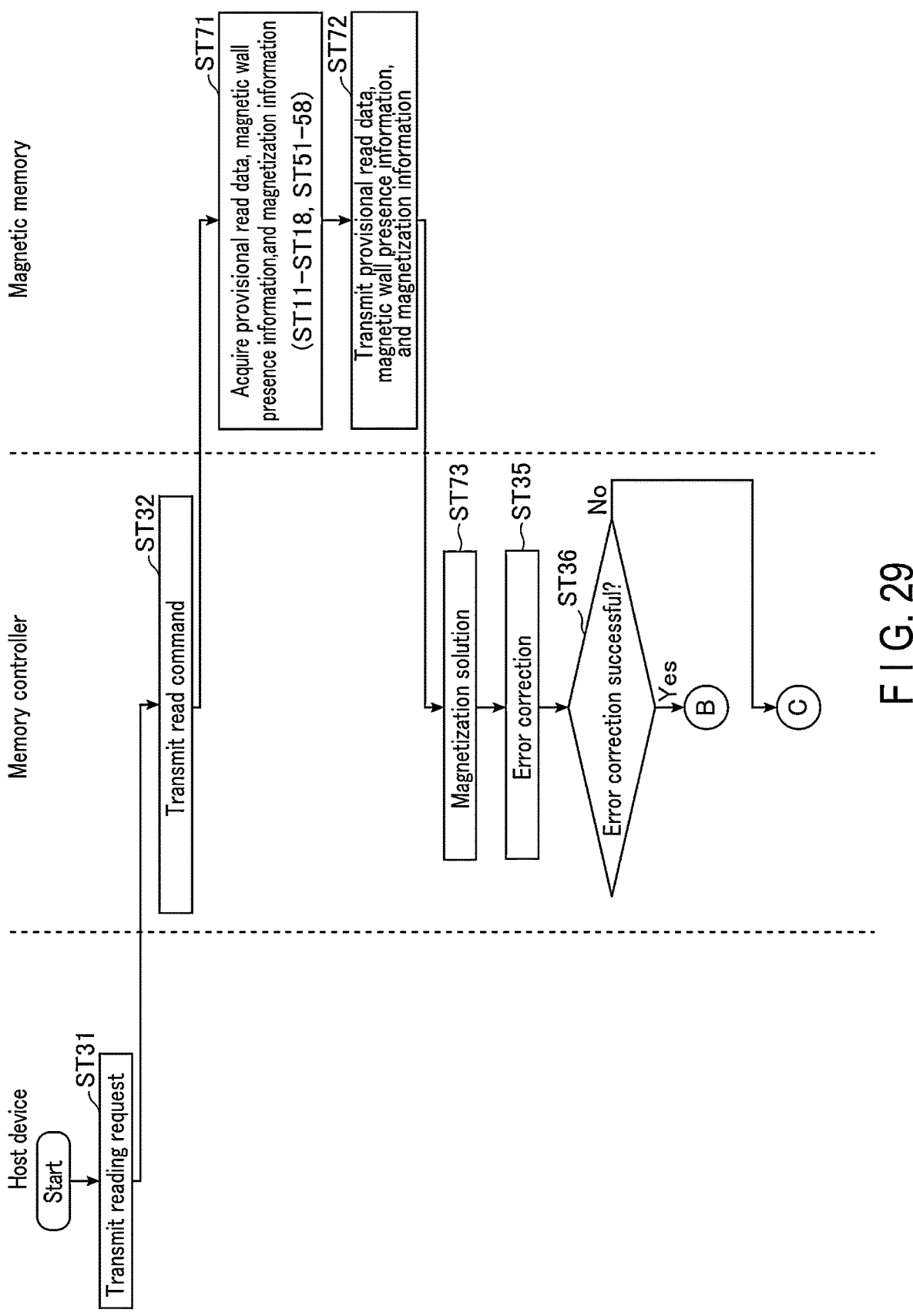
F I G. 29

MAGNETIC MEMORY AND MEMORY SYSTEM

CROSS-REFERENCE TO RELATED APPLICATIONS

This application is based upon and claims the benefit of priority from Japanese Patent Application No. 2023-112947, filed Jul. 10, 2023, the entire contents of which are incorporated herein by reference.

FIELD

Embodiments described herein relate generally to a magnetic memory and a memory system.

BACKGROUND

There is known a memory system including a memory and a memory controller. Examples of the memory include a magnetic memory using a magnetic body. The memory system is demanded to be capable of accurate data storing and output.

BRIEF DESCRIPTION OF THE DRAWINGS

FIG. 1 is a block diagram showing an example of functional blocks of an information processing system including a memory system according to the first embodiment.

FIG. 2 is a block diagram showing an example of functional blocks of the memory system according to the first embodiment.

FIG. 3 is a block diagram showing an example of functional blocks of a magnetic memory of the memory system according to the first embodiment.

FIG. 4 is a view showing an example of components of a memory cell array of the memory system according to the first embodiment.

FIG. 6 is a view showing an example of the structure of a magnetic body and a layer stack of the memory system according to the first embodiment.

FIG. 7 is a block diagram showing an example of components of a read circuit of the memory system according to the first embodiment.

FIG. 8 is a flowchart showing the procedure of data writing by the magnetic memory of the memory system according to the first embodiment.

FIG. 9 is a view showing a state concerning some elements during an operation in the memory system according to the first embodiment.

FIGS. 10, 11, 12, 13, and 14 are views showing states concerning some components during the operation in the memory system according to the first embodiment.

FIG. 15 is a flowchart showing the procedure of data reading by the magnetic memory of the memory system according to the first embodiment.

FIG. 16 is a flowchart showing the procedure of data reading by the memory system according to the first embodiment.

FIG. 17 is a view showing unintended switching of the magnetization state of unit portion.

FIG. 18 is a block diagram showing an example of functional blocks of a memory controller of a memory system according to the second embodiment.

FIG. 19 is a flowchart showing the procedure of data reading by a magnetic memory of the memory system according to the second embodiment.

FIG. 20 is a flowchart showing the procedure of data reading by the memory system according to the second embodiment.

FIG. 21 is a block diagram showing an example of functional blocks of the magnetic memory of a memory system according to the third embodiment.

FIG. 22 is a view showing states concerning some elements during an operation in the memory system according to the third embodiment.

FIG. 23 is a flowchart showing the procedure of data reading by a magnetic memory of the memory system according to the third embodiment.

FIG. 24 is a flowchart showing the procedure of data reading by the magnetic memory of the memory system according to the third embodiment.

FIGS. 25 and 26 are flowcharts showing the procedure of data reading by the memory system according to the third embodiment.

FIG. 28 is a flowchart showing the procedure of data reading by the magnetic memory of a memory system according to the fourth embodiment.

FIG. 29 is a flowchart showing the procedure of data reading by the memory system according to the fourth embodiment.

DETAILED DESCRIPTION

Figure 5:
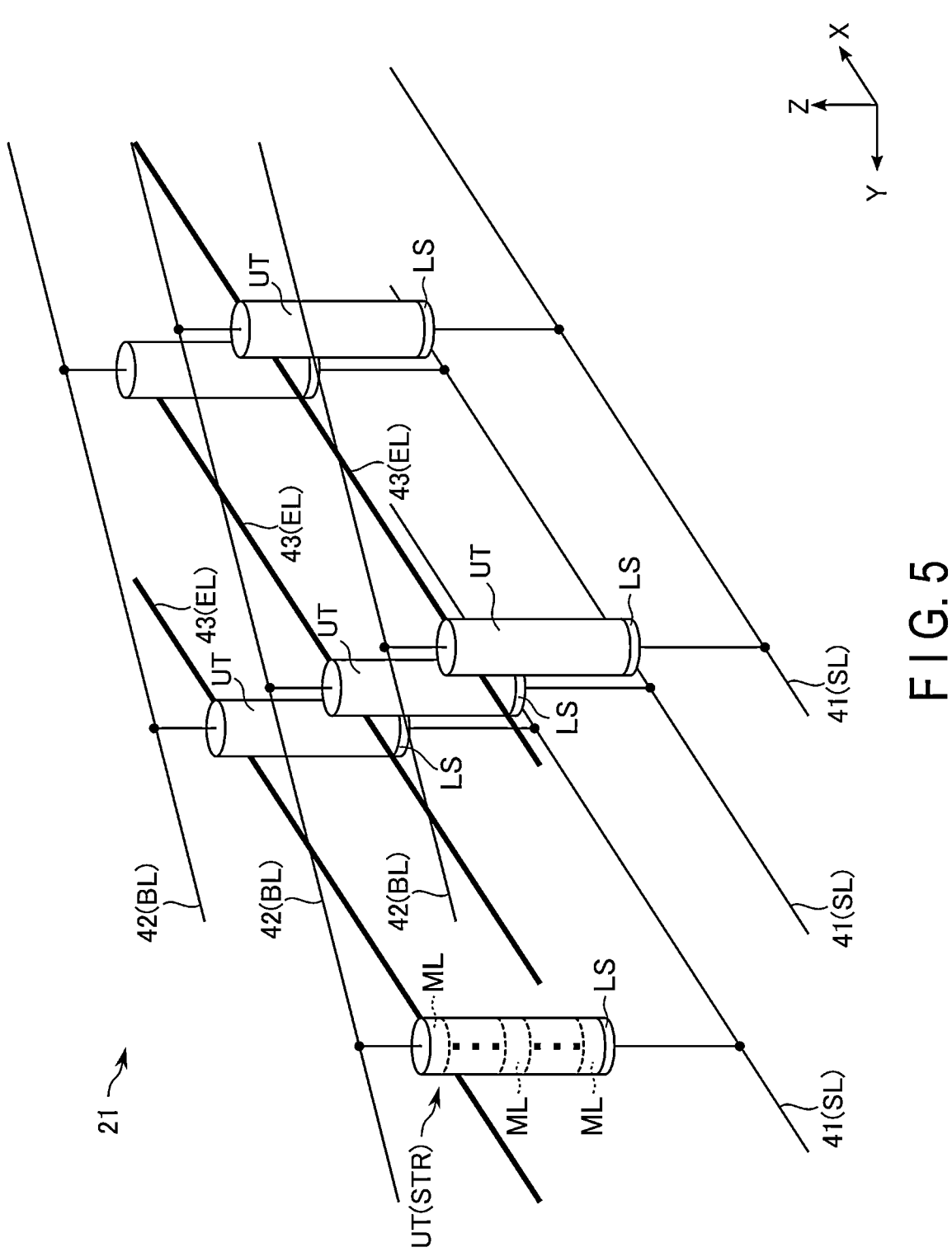
FIG. 5 is a view showing an example of a partial structure of the memory cell array of the memory system according to the first embodiment.

In one embodiment, a magnetic memory includes a magnetic body; a first circuit; a first storage circuit; a second storage circuit; and a second circuit. The magnetic body extends in a first direction and includes portions aligned in the first direction. The first circuit is configured to output first information indicating presence or absence of a magnetic wall between two portions which are adjacent among the portions, and second information based on the combination of magnetization states of the two portions. The first storage circuit is configured to store first bits respectively corresponding to the portions, where a most significant bit of the first bits has a value independent of a magnetization state of its corresponding portion among the portions, and each of the first bits has a value based on the first information. The second storage circuit is configured to store the second information in a second bit. The second circuit is configured to cause the first storage circuit to output the first bits when a value of a least significant bit of the first bits matches a value of the second information stored in the second storage circuit, and cause the first storage circuit to output third bits having inverse values of the first bits in respective bits when the value of the least significant bit of the first bits is different from the value of the second information stored in the second storage circuit.

Embodiments will now be described with reference to the figures. In order to distinguish components having substantially the same function and configuration in an embodiment or over different embodiments from each other, an additional numeral or letter may be added to the end of each reference numeral or letter. For an embodiment subsequent to an embodiment that has already been described, the description will concentrate mainly on the matters that differ from the already described embodiment. The entire description of a particular embodiment applies to another embodiment unless an explicit mention is made otherwise, or an obvious elimination is involved.

Each functional block may be implemented as hardware, computer software, or their combination. For this reason, in order to clearly illustrate that each block can be any of hardware, software or a combination thereof, descriptions will be made in terms of their functionalities in general.

Steps in the flow of a method according to an embodiment are not limited to any of the illustrated orders, and may occur in an order different from the illustrated orders and/or may occur concurrently with another step or steps.

The specification and the claims, when mentioning that a particular (first) component is "coupled" to another (second) component, intend to cover both the form of the first component directly coupled to the second component and the form of the first component coupled to the second component via one or more components which are always or selectively conductive.

1. First Embodiment 1.1. Configuration (Structure)
1.1.1. Information Processing System FIG. 1 shows functional blocks of an information processing system including a memory system according to a first embodiment. An information processing system 100 includes a memory system 1 and host device 5.

The host device 5 requests the memory system 1 to execute data reading and data writing.

The memory system 1 is a system configured to store data. The memory system 1 receives a data writing request from the host device 5 and stores requested data. The memory system 1 receives a data reading request from the host device 5 and transmits requested data to the host device 5.

1.1.2. Memory System

FIG. 2 shows an example of functional blocks of the memory system 1 according to the first embodiment. As shown in FIG. 2, the memory system 1 includes a magnetic memory 2 and a memory controller 3.

The magnetic memory 2 is a device configured to store data in a nonvolatile manner using magnetization. The magnetic memory 2 includes a magnetic body having a plurality of magnetic domains and is configured to store data using a magnetization direction of a magnetic domain.

The memory controller 3 is a device configured to control the magnetic memory 2. The memory controller 3 exerts, over the magnetic memory 2, control for execution of data reading and data writing based on a request from the host device 5.

The memory controller 3 includes functional blocks such as a host interface 11, a read only memory (ROM) 12, a random access memory (RAM) 13, a central processing unit (CPU) 14, a memory interface 15, and an error correction circuit 16.

The memory controller 3 functions, based on an operation in execution, as a sub portion such as an error correction controller, a write controller, a read controller, a signal transmission controller, a signal reception controller. The error correction controller controls an overall processing performed for error correction, and performs data division, data coupling, temporal data storage, data supply, control over the encoding controller, and control over the decoding controller. The write controller controls processing for writing data into the magnetic memory 2, and performs preparation of data to be written into the magnetic memory 2 and generation of a command CMD for writing and an address information ADD. The read controller controls processing for reading data from the magnetic memory 2, and performs generation of a command CMD for reading and an address information ADD for specifying data, based on data to be read from the magnetic memory 2. The signal transmission controller controls transmission of a signal including data DAT, a command CMD, address information ADD, and a control signal CNT to the magnetic memory 2, and controls the memory interface 15. The signal reception controller controls reception of signals including data DAT and a control signal CNT from the magnetic memory 2, and controls the memory interface 15.

The host interface 11 is an interface for the memory controller 3 to communicate with the host device 5. The host interface 11 may be configured of hardware, or a combination of hardware and software. The host interface 11 is coupled to the host device 5 via an interconnect for enabling communications according to a scheme (or a standard) which the host interface 11 and the host device 5 comply with.

The ROM 12 is a nonvolatile memory. The ROM 12 stores programs including firmware. The program is configured to cause the memory controller 3 to execute the operation described in this specification when it is executed by the CPU 14. The ROM 12 may be implemented as a single semiconductor chip, may be implemented as a plurality of independent semiconductor chips, or may be a circuit formed on a semiconductor substrate.

The RAM 13 is a volatile memory. The RAM 13 temporarily stores data, and stores programs stored in the ROM 12 while the memory system 1 is being supplied with a power supply. Examples of the RAM 13 include a dynamic random access memory (DRAM) and static RAM (SRAM). The RAM 13 further functions as a working memory and a data buffer while the memory controller 3 is in operation. The RAM 13 may be implemented as a single semiconductor chip, may be implemented as a plurality of independent semiconductor chips, or may be a circuit formed in a semiconductor substrate.

The CPU 14 is a circuit configured to control the overall operation of the memory controller 3. Through execution of programs stored in the ROM 12 and loaded onto the RAM 13 by the CPU 14, the memory controller 3 executes various operations and functions as various sub portions. The CPU 14 may be implemented as a single semiconductor chip, may be implemented as a plurality of independent semiconductor chips, or may be a circuit formed on a semiconductor substrate.

The memory interface 15 is an interface for the memory controller 3 to communicate with the magnetic memory 2. The memory interface 15 may be configured of hardware, or a combination of hardware and software. The memory interface 15 is coupled to the magnetic memory 2 via an interconnect for enabling communications according to a scheme which the magnetic memory 2 and the memory controller 3 comply with. The memory interface 15 transmits a command CMD and address information ADD to the magnetic memory 2. The memory interface 15 transmits a control signal CNT and data DAT to the magnetic memory 2, and receives the control signal CNT and the data DAT from the magnetic memory 2.

A command CMD indicates the operation to be executed by the magnetic memory 2. Address information ADD specifies the data reading or writing target region in the magnetic memory 2. A control signal CNT is a signal for controlling an operation timing between the magnetic memory 2 and the memory controller 3 and an operation timing in the magnetic memory 2.

The error correction circuit 16 detects and corrects the error of data read from the magnetic memory 2 by using an Error Correction Code (ECC). The error correction circuit 16 generates an error correction code from data (actual write data) to be written in the magnetic memory 2. The actual write data and the error correction code generated from the actual write data are written in the magnetic memory 2. The error correction circuit 16 uses the error correction code to detect an error in the data read from the magnetic memory 2, and corrects the error if any error is detected. The error correction circuit 16 may be implemented as an independent dedicated semiconductor chip, may be a circuit formed on a semiconductor substrate, or may be implemented by the CPU 14 executing firmware.

1.1.3. Magnetic Memory

FIG. 3 shows functional blocks of a magnetic memory of the memory system according to the first embodiment. As shown in FIG. 3, the magnetic memory 2 includes functional blocks such as a memory cell array 21, an input and output circuit 22, a control circuit 23, a row selector 24, a column selector 25, a write circuit 26, a read circuit 27, a shift control circuit 29, a data latch 31, a magnetization information latch 32, and a magnetization solution circuit 33.

The memory cell array 21 includes a plurality of strings STR. Each string STR includes a plurality of memory cells MC. Each memory cell MC is capable of storing one-bit data in a nonvolatile manner and includes magnetic material. In the memory cell array 21, interconnects such as a plurality of source lines SL, a plurality of bit lines BL, and a plurality of field lines EL, are positioned. The interconnects are not shown in FIG. 3.

The input and output circuit 22 is a circuit that performs signal input to the magnetic memory 2 and signal output from the magnetic memory 2. The input and output circuit 22 is coupled to the memory controller 3 by wiring. The input and output circuit 22 receives a control signal CNT, a command CMD, address information ADD, and data DAT from the memory controller 3. The input and output circuit 22 transmits a control signal CNT and data DAT to the memory controller 3. In a case of data writing in the magnetic memory 2, data DAT includes write data. In a case of data reading from the magnetic memory 2, data DAT includes read data.

The row selector 24 is a circuit for selecting a row of the memory cell MC. The row selector 24 receives the address information ADD from the input and output circuit 22. The row selector 24 acquires a row address from the address information ADD. The row selector 24 sets the row specified by the row address in the memory cell array 21 to the selected state. The row selector 24 includes circuits such as a multiplexer, a switching circuit, and a driver circuit.

The column selector 25 is a circuit for selecting a column of the memory cell MC. The column selector 25 receives the address information ADD from the input and output circuit 22. The column selector 25 acquires a column address from the address information ADD. The column selector 25 sets the column (for example, bit line BL) specified by the column address in the memory cell array 21 to the selected state. The column selector 25 includes circuit such as a multiplexer, a switching circuit, and a driver circuit.

The write circuit 26 is a circuit that controls data writing to the memory cell MC. The write circuit 26 supplies a write current or write voltage to the memory cell array 21 during data writing. With this, data is written in the selected memory cell MC. For example, the write circuit 26 is coupled to the memory cell array 21 via the row selector 24. The write circuit 26 includes a voltage source and/or a current source.

The read circuit 27 is a circuit that controls data reading from the memory cell MC. The read circuit 27 supplies a read current or voltage to the memory cell array 21, senses a signal output from the memory cell MC, and outputs data concerning the state of the data reading target memory cell MC. The data concerning the state of the data reading target memory cell MC includes magnetic wall presence information and magnetization information. The magnetic wall presence information indicates, by at least one bit, whether the magnetizations of certain two adjacent memory cells MC are determined to be different. The magnetization information indicates, by at least one bit, the combination of magnetizations of certain two adjacent memory cells MC. The magnetization information represents the change of the state of the state determination target memory cell MC from the state of the memory cell MC adjacent to the determination target memory cell MC.

The shift control circuit 29 is a circuit that controls shift of the memory cell MC. The shift control circuit 29 shifts the magnetic walls to store data in the memory cell MC of the designated address and to read data from the memory cell MC of the designated address. The shift control circuit 29 supplies a current or a voltage to the memory cell array 21, thereby shifting the magnetic walls. For example, the shift control circuit 29 is coupled to the memory cell array 21 via the column selector 25.

The data latch 31 is a circuit that stores data. In a case of data writing, the data latch 31 receives write data from the input and output circuit 22, and transmits the received write data to the write circuit 26. During data reading, the data latch 31 stores read data and provisional read data. The provisional read data is used to generate read data. The data latch 31 further has a function of a shift register, and a function of storing data obtained by inverting one or more specified bit values of stored data. The data latch 31 transmits the read data to the input and output circuit 22.

The magnetization information latch 32 is a circuit that stores magnetization information. The magnetization information latch 32 can store one or more bits. The magnetization information latch 32 receives magnetization information from the magnetization solution circuit 33.

The magnetization solution circuit 33 is a circuit that generates read data from magnetic wall presence information and magnetization information. The magnetization solution circuit 33 stores the received latest magnetization information in the magnetization information latch 32. Based on the received magnetic wall presence information, the magnetization solution circuit 33 generates information indicating data that is determined to be stored in the reading target memory cell MC, and generates provisional read data. The magnetization solution circuit 33 refers to the magnetization information in the magnetization information latch 32, and uses the magnetization information to generate, from the provisional read data, read data that is determined to be stored in the reading target memory cell MC.

The control circuit 23 is a circuit that controls the entire magnetic memory 2. The control circuit 23 receives a control signal CNT and a command CMD from the input and output circuit 22. The control circuit 23 generates a control signal based on the control instructed by the control signal CNT, and the command CMD. The control circuit 23 uses the generated control signal to control the write circuit 26, the read circuit 27, the shift control circuit 29, and the magnetization solution circuit 33.

1.1.4. Memory Cell Array

FIG. 4 shows components of a memory cell array of the memory system according to the first embodiment. As shown in FIG. 4, each string STR includes N memory cells MC_0 to MC_N-1. N is a positive integer. In each string STR, memory cells MC of the string STR concerned are each formed by portions of a single magnetic body, which extends in a certain direction.

FIG. 5 shows a partial structure of the memory cell array of the memory system according to the first embodiment.

As shown in FIG. 5, the memory cell array 21 includes a plurality of magnetic bodies UT and a plurality of layer stacks LS. Furthermore, in the memory cell array 21, a plurality of conductors 41, a plurality of conductors 42, and a plurality of conductors 43 are positioned.

The magnetic bodies UT are aligned (arranged) in the X direction and the Y direction orthogonal to each other. Each magnetic body UT has a linear shape and extends in the Z direction. The Z direction is orthogonal to the X direction and the Y direction. Hereinafter, a position in the Z direction from a certain position may be referred to as "above", and a position in the direction (–Z direction) opposite to the Z direction from a certain position may be referred to as "below". In one example, each magnetic body UT includes a thin-film magnetic body on the surface and a non-magnetic body inside. Each magnetic body UT functions as a single string STR. Each magnetic body UT includes a plurality of unit portions ML. The respective unit portions ML are aligned one by one in the direction in which the magnetic bodies UT extend, and are each in contact with an adjacent unit portion ML.

Each of the layer stacks LS includes a plurality of magnetic bodies and a plurality of insulators. The plurality of magnetic bodies and the plurality of insulators each have a layer shape and are aligned in the Z direction. Each of the layer stacks LS includes a structure functioning as a switching element and a structure functioning as a magnetic tunneling junction (MTJ) element. The structure functioning as an MTJ element is positioned on the upper surface of the structure functioning as the switching element. Each of the layer stacks LS is in contact with a lower surface of a single magnetic body UT. The structure functioning as an MTJ element includes an MTJ, two ferromagnetic bodies, and an insulator between the two ferromagnetic bodies. The structure functioning as a switching element controls electrical conduction and non-conduction between both ends of the switching element.

Each of the conductors 41 is positioned further in the –Z direction than the set of layer stacks LS. The conductors 41 extend in the X direction and are aligned in the Y direction. Each of the conductors 41 functions as a single source line SL. Each of the conductors 41 is coupled to the lower surfaces of the layer stacks LS aligned in the X direction.

Each of the conductors 42 is positioned further in the Z direction than the set of the magnetic bodies UT. The conductors 42 extend along the X-Y plane formed by the X direction and the Y direction and are aligned in a direction intersecting the X direction and the Y direction, for example, a direction intersecting the extending direction of the conductor 42. Each of the conductors 42 functions as a single bit line BL. Each of the conductors 42 is coupled to the upper surface of each of the magnetic bodies UT different from the magnetic bodies UT coupled to a single conductor 41.

The conductors 43 extend in the X direction. Each of the conductors 43 extends along the unit portions ML each positioned in the upper end of each of the magnetic bodies UT aligned in the X direction. Each of the conductors 43 has a space from the unit portions ML each positioned in the upper end of each of the magnetic bodies UT aligned in the X direction. Each of the conductors 43 functions as a single field line EL. By a current flowing through a conductor 43 during data writing, a magnetic field is caused in the periphery of the conductor 43. By this magnetic field, the unit portions ML each aligned with a space from the conductor 43 are given magnetization in a direction based on the direction of the magnetic field.

FIG. 6 shows an example of the structure of a magnetic body and a layer stack of the memory system according to the first embodiment. As has been described above with reference to FIG. 5, the magnetic body UT includes a plurality of unit portions ML, for example, N unit portions ML_0 to ML_N-1. The X-Y area at the boundary between two adjacent unit portions ML is smaller than the X-Y areas elsewhere. The X-Y area is the area in a plane along the X-Y plane. Since the X-Y area at each boundary of the unit portion ML is small, the magnetic wall is more likely to remain at the boundary of the unit portion ML than elsewhere. Based on the tendency of the magnetic wall to remain at the boundary of the unit portion ML, a magnetic domain is formed in each unit portion ML. Each magnetic domain has magnetization. The magnetization can have one of two different directions. The magnetization direction is variable under the control of the magnetic memory 2. For the sake of easy understanding, FIG. 6 shows a form in which each unit portion ML has a single magnetic domain. However, if two or more adjacent unit portions ML have magnetizations of the same direction, the region formed by these unit portions ML has a single magnetic domain and has no magnetic wall. The magnetic memory 2 stores one-bit data depending on the magnetization direction in each unit portion ML. That is, each unit portion ML functions as a single memory cell MC.

The conductor 43 is aligned with the uppermost unit portion ML_0. Data writing is performed with respect to the memory cell MC located in the unit portion ML_0. The unit portion ML_0 may be referred to as a write position.

The layer stack LS includes an MTJ element MTJ and variable resistance material SEL. The variable resistance material SEL functions as a switching element. The variable resistance material SEL is a material exhibiting dynamically variable resistance, and has, for example, a layer shape. The variable resistance material SEL is a switching element between its two terminals where a first terminal of the two terminals is one of the upper surface and the lower surface of the variable resistance material SEL, and a second terminal of the two terminals is the other of the upper surface and the lower surface of the variable resistance material SEL. When a voltage applied between the two terminals is lower than a certain threshold voltage, the variable resistance material is in a "high resistance" state, for example, an electrically non-conductive state. When the voltage applied between the two terminals rises to be equal to or higher than the threshold voltage, the variable resistance material enters a "low resistance" state, for example, an electrically conductive state. When the voltage applied between the two terminals of the variable resistance material SEL in the low resistance state drops to be lower than the threshold voltage, the variable resistance material enters the high resistance state.

In one example, the variable resistance material SEL includes an insulator and a dopant introduced into the insulator by ion implantation. The insulator includes, for example, an oxide which may be $SiO_2$, or a material consisting substantially of $SiO_2$. In one example, the dopant includes arsenic (As) and germanium (Ge). The description "consisting (or formed) substantially of" and similar terms are meant to permit a component "consisting substantially of" something to contain unintended impurities.

The MTJ element MTJ includes a ferromagnetic layer RL, an insulating layer TB, and a ferromagnetic layer FL. In one example, as illustrated in FIG. 6, the insulating layer TB is located on the upper surface of the ferromagnetic layer RL, and the ferromagnetic layer FL is located on the upper surface of the insulating layer TB.

The ferromagnetic layer RL is a layer of a material exhibiting ferromagnetism. The ferromagnetic layer RL has an axis of easy magnetization in a certain direction. A magnetization direction of the ferromagnetic layer RL is intended to be unchanged even by reading and writing of data in the memory cell MC and application of voltage or current for shifting magnetic walls. The ferromagnetic layer RL functions as a so-called reference layer. The ferromagnetic layer RL may include a plurality of layers.

The insulating layer TB is a layer of an insulator. The insulating layer TB includes or consists substantially of, for example, magnesium oxide (MgO) and functions as a so-called tunnel barrier.

The ferromagnetic layer FL is a layer of a material exhibiting ferromagnetism. The ferromagnetic layer FL includes or consists substantially of, for example, cobalt iron boron (CoFeB) or iron boride (FeB). The ferromagnetic layer FL has an axis of easy magnetization in a certain direction. The magnetization direction of the ferromagnetic layer FL is variable, and in synchronization with the magnetization direction of the lowermost unit portion ML_N-1, for example, has a magnetization direction parallel to the magnetization direction of the lowermost unit portion ML_N-1. The ferromagnetic layer FL functions as a so-called storage layer (Free Layer).

When a magnetization direction of the storage layer FL is parallel to the magnetization direction of the reference layer RL, the MTJ element MTJ has a certain low resistance. When the magnetization direction of the storage layer FL is antiparallel to the magnetization direction of the reference layer RL, the MTJ element MTJ has a resistance higher than the resistance in the case in which the magnetization direction of the storage layer FL and the magnetization direction of the reference layer RL are parallel. Based on the resistance of the MTJ element, it is possible to determine the magnetization direction of the storage layer FL, and the magnetization direction of the unit portion ML_N-1. Data stored in the memory cell MC located in the unit portion ML_N-1 can be determined from the magnetization direction of the unit portion ML_N-1. The lowermost unit portion ML_N-1 may be referred to as a read position.

Hereinafter, when a certain unit portion has magnetization in one and the other of two opposite directions, the unit portion is said to be in the N-pole state and the S-pole state, respectively.

To read data from a certain memory cell MC, the magnetic walls of the magnetic bodies UT is shifted toward the layer stack LS until the reading target memory cell MC reaches the unit portion ML_N-1. That is, data writing is executed in the unit portion ML_0, and data reading is executed in the unit portion ML_N-1. Such a data writing/reading scheme is a First In, First Out (FIFO) scheme.

The layer stack LS may include a further layer such as a conductor.

1.1.5. Read Circuit

FIG. 7 shows an example of components of a read circuit of the memory system according to the first embodiment. As shown in FIG. 7, the read circuit 27 includes information holding circuits 271 and 272 and a sense amplifier 273.

Each of the information holding circuits 271 and 272 holds a physical value reflecting the magnetization direction of a memory cell MC, that is, whether the memory cell MC is in the N-pole state or the S-pole state. That is, based on the magnetization direction of the memory cell MC, the MTJ element MTJ is in a high resistance state or a low resistance state. Accordingly, it is possible to acquire the physical value based on the resistance state of the MTJ element MTJ. The physical value reflects the magnetization state of the memory cell MC at the read position, that is, whether the memory cell MC is in the N-pole state or the S-pole state. Examples of the physical value include a voltage based on the resistance of the memory cell MC. In this example, the information holding circuits 271 and 272 are capacitors.

One of the information holding circuits 271 and 272 holds a value based on the state of the memory cell MC at the read position. The memory cell MC at the read position may be referred to as a read position cell MC. The other of the information holding circuits 271 and 272 holds a value based on the state of the memory cell MC adjacent to the read position cell MC in the −Z direction, for example, holds a value based on the state of the memory cell MC that was at the read position before the magnetic wall is shifted. The memory cell MC adjacent to the read position cell MC in the −Z direction may be referred to as a preceding read position cell MC.

The sense amplifier 273 outputs magnetic wall presence information and magnetization information based on the respective values of the information holding circuits 271 and 272, that is, the value concerning the read position cell MC and the value concerning the preceding read position cell MC.

If the value concerning the read position cell MC and the value concerning the preceding read position cell MC are substantially the same, for example, if the difference between the two values falls within a certain range, this means that the read position cell MC and the preceding read position cell MC have the same magnetization state. In this case, no magnetic wall exists between the read position cell MC and the preceding read position cell MC. Hence, the sense amplifier 273 outputs magnetic wall presence information indicating that no magnetic wall exists, for example, "0" data.

On the other hand, if the value concerning the read position cell MC is different from the value concerning the preceding read position cell MC, for example, if the difference between the two values falls outside the certain range, this means that the read position cell MC and the preceding read position cell MC have different magnetization states. In this case, a magnetic wall exists between the read position cell MC and the preceding read position cell MC. Hence, the sense amplifier 273 outputs magnetic wall presence information indicating that a magnetic wall exists, for example, "1" data.

If the preceding read position cell MC is in the N-pole state and the read position cell MC is in the S-pole state, magnetization information has a value indicating this, for example, "0" data. On the other hand, if the preceding read position cell MC is in the S-pole state and the read position cell MC is in the N-pole state, magnetization information has a value indicating this, for example, "1" data. The value of the magnetization information may be vice versa.

1.2. Operation

The following description is based on an example in which the magnetic memory 2 treats the memory cell MC in the S-pole state as storing "0" data, and treats the memory cell MC in the N-pole state as storing "1" data. The magnetic memory 2 may store "1" data by the memory cell MC in the S-pole state, and store "0" data by the memory cell MC in the N-pole state.

1.2.1. Data Writing

FIG. 8 shows the procedure of data writing by the magnetic memory of the memory system according to the first embodiment. The procedure shown in FIG. 8 is started when the magnetic memory 2 receives a write command instructing data writing and write data. The write command includes or accompanies the address information ADD specifying the memory cell MC to store the write data.

The magnetic memory 2 sets the write data in the data latch 31 (step ST1). The write data includes one or more bits. In a case of writing data of a plurality of bits, data is written bit by bit.

The magnetic memory 2, for example, the write circuit 26 selects, from the write data, the bit (write bit) to be written in the memory cell MC (step ST2). The write bit is, for example, sequentially selected one by one from a most significant bit to a least significant bit in the bit string of the write data.

The magnetic memory 2, for example, the control circuit 23 controls the shift control circuit 29 to shift the write destination memory cell MC to the write position (step ST3). If the memory cell MC at the write position is an unwritten memory cell, step ST3 is skipped.

If the bit to be written has "0" data (Yes in step ST4), the magnetic memory 2, for example, the write circuit 26 sets the write destination memory cell MC in the S-pole state (step ST5). If the bit to be written has "1" data (No in step ST4), the magnetic memory 2, for example, the write circuit 26 sets the write destination memory cell MC in the N-pole state (step ST6).

Steps ST5 and ST6 continue to step ST7. The magnetic memory 2, for example, the write circuit 26 determines whether all of bits of the write data have been written (step ST7). If all of bits have been written (Yes in step ST7), the procedure shown in FIG. 8 ends. If not all of bits have been written (No in step ST7), the procedure transitions to step ST2.

1.2.2. Data Reading

Data reading uses magnetization solution. The principle of magnetization solution will be described with reference to FIGS. 9, 10, 11, 12, 13, and 14. FIGS. 9, 10, 11, 12, 13, and 14 sequentially show states concerning some elements during an operation in the memory system according to the first embodiment. Each of FIGS. 9, 10, 11, 12, 13, and 14 shows different times in the lateral direction of the drawing. Each of FIGS. 9, 10, 11, 12, 13, and 14 shows the unit portion ML at the read position and some unit portions ML arranged alongside this unit portion ML in the uppermost row of the drawing. Each of FIGS. 9, 10, 11, 12, 13, and 14 shows magnetic wall presence information, provisional read data, and the value of the magnetization information latch in the second row, the third row, and the lowermost row from top, respectively. The provisional read data is a bit string including as many bits as the memory cells MC to be read. The provisional read data indicates the magnetization state of a certain memory cell MC in each bit. The bits of the provisional read data from the most significant bit to the least significant bit indicate the values of the memory cells MC from the head to the end in the direction of magnetic wall shift during reading, respectively. The bits of the provisional read data are referred to as the first-place bit, the second-place bit, the third-place bit, the fourth-place bit, and the fifth-place bit from the least significant bit (or end bit) to the most significant bit (or head bit). Hereinafter, a state in which the value of each bit has invalid data is indicated by symbol "-".

As shown in FIG. 9, as one example, reading targets are five memory cells MC, and unit portions ML_N-1, ML_N-2, ML_N-3, ML_N-4, and ML_N-5 are in a state 0. In the state 0, the unit portions ML_N-1, ML_N-2, ML_N-3, ML_N-4, and ML_N-5 are occupied by memory cells MC1, MC2, MC3, MC4, and MC5, respectively. The memory cells MC1, MC2, MC4, and MC5 are in the N-pole state, and the memory cell MC3 is in the S-pole state.

Figure 10:
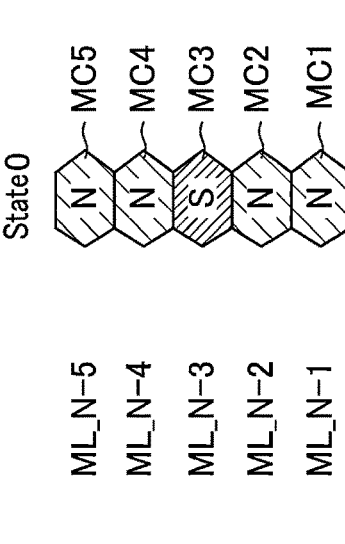
Figure 10:
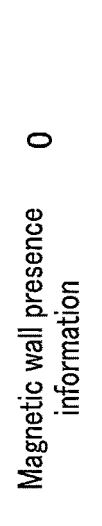
Figure 10:
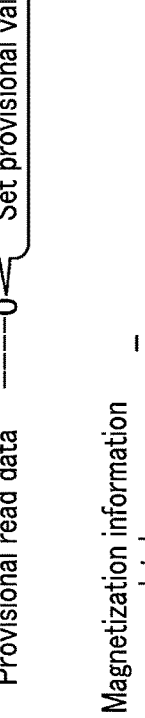

Since the magnetization state of the memory cell MC1 is unknown, as shown in FIG. 10, the magnetization solution circuit 33 stores data having a provisional value in the first-place bit of the provisional read data. Accordingly, the provisional read data has "----0" in the fifth- to first-place bits. Data having a provisional value may be "0" data (that is, data indicating the S-pole state), or may be "1" data (that is, data indicating the N-pole state). First, an example of inputting "0" data, that is, an example of assuming the magnetization state opposite to the magnetization state of the memory cell MC1 will be described. That is, it is assumed that the memory cell MC1 is in the S-pole state, and the succeeding processing is performed based on this assumption.

Since no magnetization change is detected, the magnetization solution circuit 33 does not update the value of the magnetization information latch 32 regardless of the value of the magnetization information.

As shown in FIG. 11, the magnetization walls are shifted, and a state 1 is obtained. In the state 1, the memory cells MC2, MC3, MC4, and MC5 are located in the unit portions ML_N-1, ML_N-2, ML_N-3, and ML_N-4, respectively.

Since the memory cell MC2 has the same magnetization state as the memory cell MC1, the magnetic wall presence information has "0" data. The magnetization solution circuit 33 shifts the bits of the provisional read data by one bit toward the upper bit side (toward the most significant bit), and stores a value based on the magnetic wall presence information in the first-place bit (the least significant bit). If the magnetic wall presence information indicates the absence of the magnetic wall, based on this, the magnetization solution circuit 33 sets, in the first-place bit of the provisional read data, the same value as the second-place bit (that is, the first-place bit before the magnetic walls are shifted). That is, the memory cell MC2 is treated as having the same S-pole state that the memory cell MC1 is assumed to have. The provisional read data has "---00" in the fifth- to first-place bits.

Since no magnetization change occurs, the magnetization solution circuit 33 does not update the value of the magnetization information latch 32 regardless of the value of the magnetization information.

As shown in FIG. 12, the magnetization walls are shifted, and a state 2 is obtained. In the state 2, the memory cells MC3, MC4, and MC5 are located in the unit portions ML_N-1, ML_N-2, and ML_N-3, respectively.

Since the memory cell MC3 has the magnetization state different from that of the memory cell MC2, the magnetic wall presence information has "1" data. The magnetization solution circuit 33 shifts the bits of the provisional read data by one bit toward the upper bit side, and stores a value based on the magnetic wall presence information in the first-place bit. If the magnetic wall presence information indicates the presence of the magnetic wall, based on this, the magnetization solution circuit 33 stores an inverse value of the second-place bit in the first-place bit of the provisional read data. That is, the memory cell MC3 is treated as having the N-pole state opposite to the S-pole state that the memory cell MC2 is assumed to have. Hence, the provisional read data has "--001" in the fifth to first-place bits.

Since magnetization change occurs, based on the assumed magnetization state of the memory cell MC2 which has been determined before the magnetic wall shift, the magnetization solution circuit 33 updates the value of the magnetization information latch 32 with a value indicating the change to the pole of the memory cell MC3. In the present example, since the memory cell MC3 has the S-pole state which is different from the N-pole state of the memory cell MC2, "0" data is set in the magnetization information latch 32.

As shown in FIG. 13, the same processing as described above with reference to FIGS. 11 and 12 is continuously performed. In a state 3, the memory cells MC4 and MC5 are located in the unit portion ML_N-0 and ML_N-1, respectively. The memory cell MC4 has the magnetization state different from the magnetization state of the memory cell MC3. Accordingly, the magnetic wall presence information has "1" data. The magnetization solution circuit 33 shifts the bits of the provisional read data by one bit toward the upper bit side, and sets a value different from the second-place bit, that is, "0" data in the first-place bit. Hence, the provisional read data has "–0010" in the fifth to first-place bits. Since the memory cell MC4 has the N-pole state which is different from the S-pole state of the memory cell MC3, "1" data is set in the magnetization information latch 32.

In a state 4, the memory cell MC5 is located in the unit portion ML_N-1. The memory cell MC5 has the same magnetization state as the memory cell MC4. Therefore, the magnetic wall presence information has "0" data. The magnetization solution circuit 33 shifts the bits of the provisional read data by one bit toward the upper bit side, and sets the same value as the second-place bit, that is, "0" data in the first-place bit. Accordingly, the provisional read data has "00100" in the fifth to first-place bits. Since no magnetization change occurs, the magnetization information latch 32 keeps "1" data.

When the magnetic walls are shifted from the state 4, shifting of the magnetic walls are completed. Then, the magnetization solution circuit 33 performs magnetization solution. Magnetization solution refers to generating read data from provisional read data based on the value of the first-place bit of the provisional read data.

The magnetization solution circuit 33 generates read data based on the value of the magnetization information latch 32 and the value of the first-place bit of the provisional read data. If the value of the magnetization information latch 32 matches the value of the first-place bit of the provisional read data, the magnetization solution circuit 33 uses the provisional read data as read data intact.

On the other hand, if the value of the magnetization information latch 32 does not match the value of the first-place bit of the provisional read data, this means that the assumed magnetization state of the first reading target memory cell MC (that is, memory cell MC1) does not match the actual magnetization state. Based on this, a set of inverse values of all bits of the provisional read data is used as read data. In the present example, the value of the magnetization information latch 32 does not match the value of the first-place bit of the provisional read data. Therefore, the magnetization solution circuit 33 uses the bit string "11011" as read data.

Figure 14:
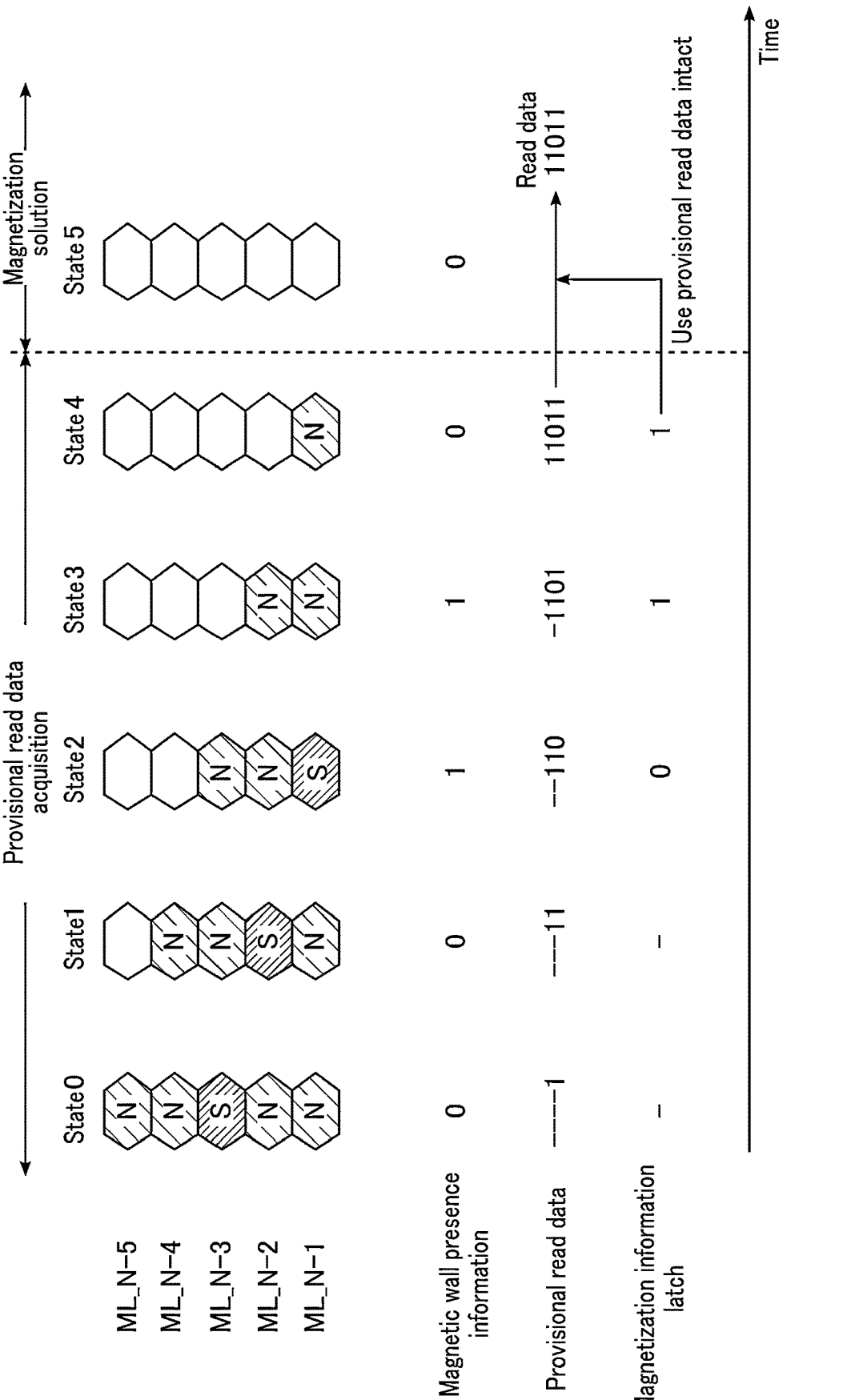

FIG. 14 shows a case where the assumed magnetization state of the first reading target memory cell MC (that is, memory cell MC1) matches the actual magnetization state, unlike in FIGS. 9, 10, 11, 12, and 13. The magnetization states of the memory cells MC1 to MC5 are the same as in FIGS. 9, 10, 11, 12, and 13.

In the state 0, the provisional read data has "----1" in the fifth to first-place bits.

In the state 1, the provisional read data has "---11" in the fifth to first-place bits.

In the state 2, the provisional read data has "--110" in the fifth to first-place bits, and the magnetization information latch 32 has "0" data.

In the state 3, the provisional read data has "–1101" in the fifth to first-place bits, and the magnetization information latch 32 has "1" data.

In the states 4 and 5, the provisional read data has "11011" in the fifth to first-place bits.

The value of the magnetization information latch 32 matches the value of the first-place bit of the provisional read data. Therefore, the magnetization solution circuit 33 uses the provisional read data as read data intact.

FIG. 15 shows the procedure of data reading by the magnetic memory of the memory system according to the first embodiment. The procedure shown in FIG. 15 is started when the magnetic memory 2 receives a read command instructing data reading. The read command includes or accompanies the address information ACC specifying the memory cell MC to read data.

First, the magnetic memory 2 acquires provisional read data and magnetization information by steps ST11, ST12, ST13, ST14, ST15, ST16, ST17, ST18, and ST19.

The magnetic memory 2, for example, the magnetization solution circuit 33 sets a provisional value in the first-place bit of the provisional read data in the data latch 31 under the control of the control circuit 23 (step ST11).

If acquisition of provisional read data is not completed for all of target memory cells MC (No in step ST12), the magnetic memory 2, for example, the control circuit 23 shifts magnetic walls (step ST13) to move the next reading target memory cell MC to the read position.

The magnetic memory 2, for example, the magnetization solution circuit 33 determines the presence/absence of the magnetic wall between the memory cell MC located at the read position and the memory cell MC having been located at the read position before the immediately preceding magnetic wall shift. If no magnetic wall is detected (No in step ST14), the magnetization solution circuit 33 shifts the bits of the provisional read data by one bit toward the upper bit side (step ST15). Then, the magnetization solution circuit 33 sets the same value as the second-place bit in the first-place bit of the provisional read data (step ST16). Step ST16 continues to step ST12.

If the magnetic wall is detected (Yes in step ST14), the magnetization solution circuit 33 shifts the bits of the provisional read data by one bit toward the upper bit side (step ST17). Then, the magnetization solution circuit 33 sets an inverse value of the second-place bit in the first-place bit of the provisional read data (step ST18).

The magnetization solution circuit 33 uses the magnetization information to update the value of the magnetization information latch 32 with a value based on the type of magnetic wall change detected in step ST14 (step ST19). Step ST19 continues to step ST12.

If acquisition of provisional read data is completed for all reading target memory cells MC (Yes in step ST12), the process transitions to step ST21. The magnetic memory 2 performs magnetization solution by steps ST21, ST22, and ST23.

If the value of the first-place bit of the provisional read data matches the value of the magnetization information latch 32 (Yes in step ST21), the magnetization solution circuit 33 uses the provisional read data as read data intact (step ST22). When read data is acquired, the procedure shown in FIG. 15 ends.

If the value of the first-place bit of the provisional read data does not match the value of the magnetization information latch 32 (No in step ST21), the magnetization solution circuit 33 generates, as read data, a set of bits having inverse values of the provisional read data (step ST23).

FIG. 16 shows the procedure of data reading by the memory system according to the first embodiment. The procedure shown in FIG. 16 is started when the host device 5 determines to read data from the memory system 1.

The host device 5 transmits a reading request command instructing data reading (step ST31). The reading request command includes or accompanies an address designating the data reading target region.

If the memory system 1 receives the reading request command, it transmits a read command to the magnetic memory 2 based on the received reading request command (step ST32). Transmitting a read command includes generating the read command. Generating a read command includes acquiring information (for example, physical address) designating the memory cell MC storing the target data of the data reading request from the target region (for example, logical address) of the data reading request. The read command includes or accompanies the address information ADD specifying the data reading target memory cell MC.

When the magnetic memory 2 receives the read command, it executes data reading using magnetization solution (step ST33). Data reading using magnetization solution includes execution of steps ST11, ST12, ST13, ST14, ST15, ST16, ST17, ST18, ST19, ST21, ST22, and ST23 of the procedure shown in FIG. 15. When step ST33 is completed, read data is obtained.

The magnetic memory 2, for example, the control unit 23 transmits the read data to the memory controller 3 (step ST34).

When the read data is received, the memory controller 3 performs error correction on the read data using the error correction circuit 16 (step ST35). If error correction is successful (Yes in step ST36), the memory controller 3 transmits the error-corrected data to the host device 5 as target data of the reading request (step ST37). A case where error correction is successful includes a case where error correction target data includes no error. When the host device 5 receives target data of the reading request (step ST38), the procedure shown in FIG. 16 ends.

If error correction fails (No in step ST36), the memory controller 3 transmits a signal indicating the read error status to the host device 5 (step ST39). When the host device 5 receives the status (step ST40), the procedure shown in FIG. 16 ends.

1.3. Advantage (Effect)

According the first embodiment, as described below, a magnetic memory and a memory system with fewer error bits in read data are provided.

It is conceivable that one-bit data is stored in the unit portion. This type will be referred to as a magnetization/data correspondence type hereinafter. The difference between the resistance of an MTJ element in which the magnetizations of two ferromagnetic layers are parallel and the resistance of an MTJ element in which the magnetizations of two ferromagnetic layers are antiparallel is small. Hence, it is difficult to store data by the magnetization/data correspondence type and read data using the resistance difference. Therefore, a memory using magnetic wall shift widely stores one-bit data between unit portions. For example, if no magnetic wall exists between two adjacent unit portions, it is treated that "0" data is stored between the unit portions. If a magnetic wall exists between two adjacent unit portions, it is treated that "1" data is stored between the unit portions. This type will be referred to as a magnetic-wall/data correspondence type hereinafter.

As shown in FIG. 17, the magnetization state of a unit portion may unintendedly change after data writing. Further, if data writing fails, data different from write data may be written. As one example, assume that it is intended that "1010" data is written or to be written using the magnetic wall by setting the unit portions ML_N-1, ML_N-2, ML_N-3, ML_N-4, and ML_N-5 in the S-pole state, the N-pole state, the N-pole state, the S-pole state, and the S-pole state, respectively, but the unit portion ML_N-2 is in the S-pole state at the time of reading. In this case, although the data intended to be written or the written data is "1010" data, "0110" data is read. This means that switching of the magnetization state of a single unit portion causes two bit errors. Furthermore, during data reading, magnetic wall shift may fail. In this case, magnetizations are erroneously determined in many unit portions, and a large number of bit errors occur.

According to the first embodiment, the magnetic memory 2 generates provisional read data by using the difference between the magnetization state of the reading target memory cell MC and the magnetization state of the memory cell MC which is adjacent to the reading target memory cell MC and whose magnetization state has been precedingly determined. The magnetic memory 2 continues to update magnetization information indicating the type of magnetization change between the two adjacent memory cells MC, and generates read data using the magnetization information and provisional read data. Although the magnetization state of the first reading target memory cell MC is unknown, it is possible to generate correct read data by using a provisional value, the magnetization change between adjacent memory cells, and the type of change even if the provisional value is incorrect. With the scheme as described above, it is possible to read data even with the magnetization/data correspondence type.

By the magnetization/data correspondence type, the number of error bits generated by switching of the magnetization state of a single unit portion is limited to one bit. Hence, the magnetic memory 2 with a few error bits is implemented.

In addition, with the magnetization/data correspondence type, the memory system and the magnetic memory according to the first embodiment can read data with low latency and have a large storage capacity. As is clear from FIG. 17, when using five unit portions ML, the magnetic-wall/data correspondence type can store four-bit data, whereas the magnetization/data correspondence type as in the first embodiment can store five-bit data. Hence, reading of data of a certain number of bits is completed earlier in the case of the magnetization/data correspondence type than in the case of the magnetic-wall/data correspondence type. The magnetization/data correspondence type using a certain number of unit portions can realize more bits than the magnetic-wall/data correspondence type using the same number of unit portions ML.

Further, owing to the magnetization/data correspondence type, the memory system and magnetic memory according to the first embodiment can add data to an unwritten unit portion of a data-written magnetic body. The magnetic-wall/data correspondence type stores different data depending on the presence/absence of the magnetic wall. Therefore, when determining the magnetization state of a certain unit portion for data writing, it is necessary to know the state of the adjacent unit portion. Therefore, it is impossible to add data in an unwritten unit portion of a data-written magnetic body. On the other hand, according to the first embodiment, owing to the magnetization/data correspondence type, it is unnecessary to know the magnetization state of the adjacent unit portion ML. Accordingly, it is possible to add data in an unwritten unit portion ML of a data-written magnetic body.

1.4. Modifications

The description so far is based on the example in which data writing and data reading are executed by the FIFO type. However, the first embodiment can also employ a LIFO (Last In First Out) type. The direction of magnetic wall shift during data reading is the same as the direction of magnetic wall shift during data writing in the FIFO type, but is opposite to the direction of magnetic wall shift during data writing in the LIFO type. In the LIFO type, a structure obtained by turning over the layer stack LS in the Z direction is located between the unit portion ML_0 and the conductor 42.

If all bits of target data of a writing request from the host device 5 have the same value, a set of unit portions ML with the data written therein has no magnetic wall. In this case, it is possible to create an error bit by, for example, intentionally inverting the value of a single bit of a bit string to be written in the memory cell. An error bit may be created by the memory controller 3 or the magnetic memory 2.

2. Second Embodiment

The second embodiment is different from the first embodiment in terms of the component that performs magnetization solution.

FIG. 18 shows an example of functional blocks of a memory controller of a memory system according to the second embodiment. As shown in FIG. 18, a memory controller 3b includes a magnetization solution unit 18 in addition to functional blocks included in the memory controller 3 according to the first embodiment. The magnetization solution unit 18 is a functional block that generates read data from provisional read data by using magnetization information. The magnetization solution unit 18 may be implemented as one or more dedicated semiconductor chips or circuits, or may be a circuit formed one a semiconductor substrate. Alternatively, the magnetization solution unit 18 may be implemented as a sub portion which is implemented by a CPU 14 executing a program stored in an ROM 12 and loaded on a RAM 13.

The magnetization solution unit 18 executes a part of the function of the magnetization solution circuit 33 of the memory system according to the first embodiment. That is, in response to the memory controller 3b transmitting a data read command, the magnetization solution unit 18 receives provisional read data and magnetization information from a magnetic memory 2b. The magnetization solution unit 18 generates read data based on the received provisional read data and magnetization information.

The magnetic memory 2b includes the same functional blocks as the magnetic memory 2 according to the first embodiment. As in the first embodiment, a magnetization solution circuit 33b of the magnetic memory 2b generates provisional read data based on magnetic wall presence information, and updates a value in a magnetization information latch 32b. On the other hand, the magnetization solution circuit 33b does not perform magnetization solution.

FIG. 19 shows the procedure of data reading by the magnetic memory of the memory system according to the second embodiment. The procedure shown in FIG. 19 is started when the magnetic memory 2b receives a read command. The procedure shown in FIG. 19 is different from the procedure shown in FIG. 15 in that the procedure ends when acquisition of provisional read data is completed for all of reading target memory cells MC (Yes in step ST12).

FIG. 20 shows the procedure of data reading by the memory system according to the second embodiment. The procedure shown in FIG. 20 is started when a host device 5 determines to read data from a memory system 1b.

As shown in FIG. 20, step ST32 continues to step ST41. As step ST41, the magnetic memory 2b acquires provisional read data and magnetization information. Acquisition of provisional read data and magnetization information includes execution of steps ST11, ST12, ST13, ST14, ST15, ST16, ST17, ST18, and ST19 of the procedure shown in FIG. 19.

The magnetic memory 2b transmits the provisional read data and the magnetization information in the magnetization information latch 32b to the memory controller 3b (step ST42).

When the memory controller 3b receives the provisional read data and magnetization information, it performs magnetization solution by using the magnetization solution unit 18 (step ST43). Magnetization solution includes execution of steps ST21, ST22, and ST23 of the procedure shown in FIG. 15 according to the first embodiment. By the magnetization solution, read data is obtained. Step ST43 continues to step ST35. The succeeding operation including step ST35 is the same as in the first embodiment (FIG. 16).

According to the second embodiment, the magnetic memory 2b generates provisional read data and magnetization information as in the first embodiment, and the memory controller 3b performs magnetization solution to generate read data. Hence, the same advantage as in the first embodiment can be obtained.

3. Third Embodiment

The third embodiment is different from the first embodiment in a method of storing magnetization information.

A memory controller 3c according to the third embodiment has the same functional blocks as the memory controller 3 according to the first embodiment. On the other hand, an error correction circuit 16c of the memory controller 3c is configured to be capable of performing operations described later.

FIG. 21 shows an example of functional blocks of a magnetic memory of a memory system according to the third embodiment. As shown in FIG. 21, a magnetic memory 2c includes a magnetic wall presence information latch 37 in addition to the functional blocks included in the magnetic memory 2 according to the first embodiment. The magnetic wall presence information latch 37 has the function of a shift register. A magnetization information latch 32c also has the function of a shift register.

FIG. 22 shows states concerning some elements during an operation in the memory system according to the third embodiment, like FIGS. 9, 10, 11, 12, 13, and 14 in the first embodiment. FIG. 22 shows magnetic wall presence information, provisional read data, the value of the magnetic wall presence information latch, and the value of the magnetization information latch in the second row, the third row, the fourth row, and the lowermost row from top, respectively.

The magnetic wall presence information latch 37 performs the same operation as a shift register, and accumulates magnetic wall presence information. That is, every time new magnetic wall presence information is received, the magnetic wall presence information latch 37 shifts the bits of the already stored magnetic wall presence information by one bit toward the upper bit side, and sets the last received magnetic wall presence information in the first-place bit.

The magnetization information latch 32c performs the same operation as a shift register, and accumulates magnetization information, unlike in the first embodiment. That is, every time new magnetization information is received, the magnetization information latch 32c shifts the bits of the already stored magnetization information by one bit toward the upper bit side, and sets the last received magnetization information in the first-place bit.

Magnetization solution is performed by comparing the value of the first-place bit of provisional read data with the value of the bit, among the bits in the magnetization information latch 32c, which is in the same place as the least significant bit among all bits having "1" data in the magnetic wall presence information latch 37. That is, if the value of the first-place bit of the provisional read data matches the value of the bit, among the bits in the magnetization information latch 32c, which is in the same place as the least significant bit among all bits having "1" data in the magnetic wall presence information latch 37, a magnetization solution circuit 33c uses the provisional read data as read data intact. Hereinafter, the least significant bit among all bits having "1" data in the magnetic wall presence information latch 37 will be sometimes referred to as the "1" data least significant bit.

On the other hand, if the value of the first-place bit of the provisional read data does not match the value of the bit, among the bits in the magnetization information latch 32c, which is in the same place as the "1" data least significant bit in the magnetic wall presence information latch 37, the magnetization solution circuit 33c uses, as read data, a set of inverse values of all bits of the provisional read data.

3.2. Operation

FIGS. 23 and 24 show the procedure of data reading by a magnetic memory of the memory system according to the third embodiment. As shown in FIGS. 23 and 24, after step ST16, the magnetization solution circuit 33c shifts the bits in the magnetic wall presence information latch 37 by one bit toward the upper bit side (step ST51). The magnetization solution circuit 33c sets "0" in the first-place bit in the magnetic wall presence information latch 37 (step ST52). The magnetization solution circuit 33c shifts the bits in the magnetization information latch 32c by one bit toward the upper bit side (step ST53). The magnetization solution circuit 33c sets "0" in the first-place bit in the magnetization information latch 32c (step ST54). Step ST54 continues to step ST12.

After step ST18, the magnetization solution circuit 33c shifts the bits in the magnetic wall presence information latch 37 by one bit toward the upper bit side (step ST55). The magnetization solution circuit 33c sets "1" in the first-place bit in the magnetic wall presence information latch 37 (step ST56). The magnetization solution circuit 33c shifts the bits in the magnetization information latch 32c by one bit toward the upper bit side (step ST57). The magnetization solution circuit 33c sets the value of magnetization information in the first-place bit in the magnetization information latch 32c (step ST58). Step ST58 continues to step ST12.

If acquisition of provisional read data is completed for all of reading target memory cells MC (Yes in step ST12), the process transitions to step ST59. The magnetic memory 2c performs magnetization solution by steps ST59, ST22, and ST23.

If the value of the first-place bit of the provisional read data matches the value of the bit, among the bits in the magnetization information latch 32c, which is in the same place as the "1" data least signification bit in the magnetic wall presence information latch 37 (Yes in step ST59), the process transitions to step ST22. If the value of the first-place bit of the provisional read data does not match the value of the bit, among the bits in the magnetization information latch 32c, which is in the same place as the "1" data least signification bit in the magnetic wall presence information latch 37 (No in step ST59), the process transitions to step ST23.

A set of steps ST15 and ST16, a set of steps ST51 and ST52, and a set of steps ST53 and ST54 can be performed in any order. A set of steps ST17 and ST18, a set of steps ST55 and ST56, and a set of steps ST57 and ST58 can be performed in any order.

FIGS. 25 and 26 show the procedure of data reading by the memory system according to the third embodiment. The procedure shown in FIGS. 25 and 26 is started when a host device 5 determines to read data from a memory system 1c.

As shown in FIGS. 25 and 26, step ST32 continues to step ST61. As step ST61, the magnetic memory 2c executes data reading using magnetization solution. Data reding using magnetization solution includes execution of steps ST11, ST12, ST13, ST14, ST15, ST16, ST17, ST18, ST22, ST23, ST51, ST52, ST53, ST54, ST55, ST56, ST57, ST58, and ST59 of the procedure shown in FIGS. 23 and 24. When step ST61 is completed, read data is obtained. Step ST61 continues to step ST34.

If error correction fails (No in step ST36), the memory controller 3c transmits, to the magnetic memory 2c, a command instructing to output the bit string of the magnetic wall presence information in the magnetic wall presence information latch 37 and the bit string of the magnetization information in the magnetization information latch 32c (step ST62).

When the command is received, the magnetic memory 2c transmits the magnetic wall presence information and the magnetization information to the memory controller 3c (step ST63).

The memory controller 3c, for example, the error correction circuit 16c generates, by inverting the values of bits in the read data which are determined using the magnetic wall presence information and magnetization information, one or more read data candidates which are assumed to have had the error based on magnetic wall misdetection corrected (step ST64). The details of generation of read data candidates which are assumed to have had the error based on magnetic wall misdetection corrected will be described later with reference to FIG. 27.

The memory controller 3c performs, by using the error correction circuit 16c, error correction on the read data candidate which is assumed to have had the error due to magnetic wall misdetection corrected (step ST65). By correcting the error due to magnetic wall misdetection, even if error correction on the read data fails in step ST36, error correction on the read data in step ST65 may be successful. If the error correction is successful (Yes in step ST66), the process transitions to step ST37. If the error correction fails (No in step ST66), the process transitions to step ST39.

Figure 27:
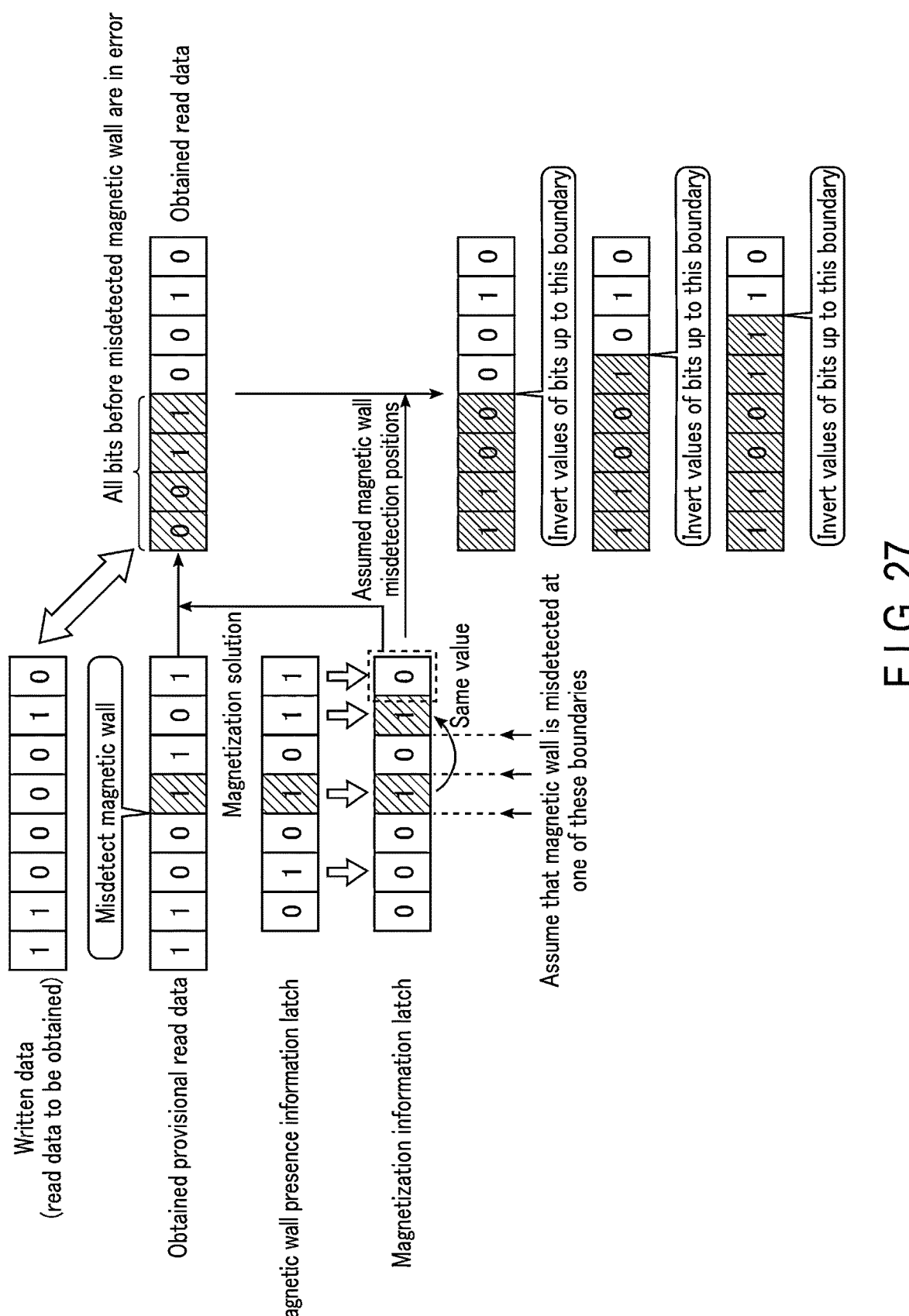
FIG. 27 is a view showing an example of data generated during an operation in the memory system according to the third embodiment.

FIG. 27 shows an example of data generated during an operation in the memory system according to the third embodiment. More specifically, FIG. 27 shows an example of data generated during correction of the error due to magnetic wall misdetection by the memory system according to the third embodiment.

Assume an example in which the data written in the reading target memory cell MC, that is, the read data to be obtained has "11000010" in the order starting from the first read bit (most significant bit). Assume that a magnetic wall is misdetected even though no magnetic wall exists between the memory cell MC storing the fourth-place bit and the memory cell MC storing the fifth-place bit. As a result, the obtained provisional read data has "11001101" in the order starting from the most significant bit. The magnetic wall presence information has "0101011" in the seventh to first-place bits. The magnetization information latch has "0001010" in the seventh to first-place bits.

By magnetization solution, read data "00110010" is generated. The read data is different from the read data to be obtained (or correct read data), and different from the correct read data in the values of all bits on the upper bit side of the misdetected magnetic wall. Based on this phenomenon, the error correction circuit 16*c* performs the following processing to generate some read data candidates which are assumed to be obtained if magnetic wall misdetection does not occur.

If a magnetic wall exists, the magnetization states of the memory cells MC on the both sides of the magnetic wall are different. Accordingly, the magnetization information latch should have opposite values for the memory cells MC on the both sides of the magnetic wall. Based on this, for example, the error correction circuit 16*c* refers to the bit in the magnetization information latch 32*c*, which is in the same place as the bit having "1" data in the magnetic wall presence information latch 37. The value is inverted between the sixth bit and the fourth-place bit. On the other hand, the fourth-place bit and the second-place bit has the same value. Since the magnetization alternately switches between two states, it should not occur that the magnetization changes in the same direction in both the first magnetic wall and the second magnetic wall adjacent to each other. Based on this, for example, the error correction circuit 16*c* assumes that magnetic wall misdetection has occurred at one of the upper bit-side boundaries of two bits indicating the presence of a magnetic wall in the magnetic wall presence information latch 37 and holding the same value in the magnetization information latch 32*c* and all boundaries between these upper bit-side boundaries. In the example shown in FIG. 27, it is assumed that magnetic wall misdetection has occurred at one of the boundary between the fifth-place bit and the fourth-place bit of the provisional read data, the boundary between the fourth-place bit and the third-place bit, and the boundary between the third-place bit and the second-place bit. Based on this assumption, a plurality of read data obtained by inverting values in all bits from the most significant bit to the boundary for each of all boundaries are generated as candidates.

According to the third embodiment, the magnetic memory 2*c* generates provisional read data and magnetization information and performs magnetization solution to generate read data, as in the first embodiment. Hence, the same advantage as in the first embodiment can be obtained.

Further, according to the third embodiment, the magnetic memory 2*c* accumulates magnetic wall presence information and magnetization information over all the reading target memory cells MC. If error correction on the first received read data in response to a read command fails, the memory controller 3*c* receives the bit string of the magnetic wall presence information and the bit string of the magnetization information from the magnetic memory 2*c*, and tries error correction on the first received read data based on the received bit strings. Hence, the memory system 1*c* has another error correction mechanism in addition to the error correction using an error correction code, and thus the memory system 1 can achieve fewer read errors.

4. Fourth Embodiment

The fourth embodiment is different from the third embodiment in terms of the component that performs magnetization solution.

A memory controller 3*d* of a memory system 1*d* according to the fourth embodiment has the same configurations as the memory controller 3*b* according to the second embodiment. However, the memory controller 3*d* is configured to be capable of performing the following operation.

A magnetic memory 2*d* of the memory system 1*d* according to the fourth embodiment includes the same functional blocks as the magnetic memory 2*c* according to the third embodiment. A magnetization solution circuit 33*d* of the magnetic memory 2*d* generates provisional read data based on magnetic wall presence information as in the first embodiment, accumulates the magnetic wall presence information in a magnetic wall presence information latch 37*d* as in the third embodiment, and accumulates magnetization information in a magnetization information latch 32*d*. On the other hand, the magnetization solution circuit 33*d* does not perform magnetization solution.

FIG. 28 shows the procedure of data reading by the magnetic memory of the memory system according to the fourth embodiment. The procedure shown in FIG. 28 is started when the magnetic memory 2*d* receives a read command. The procedure shown in FIG. 28 is different from the procedure shown in FIG. 23 according to the third embodiment in that the procedure ends when acquisition of provisional read data is completed for all of reading target memory cells MC (Yes in step ST12).

FIG. 29 shows the procedure of data reading by the memory system according to the fourth embodiment. The procedure shown in FIG. 29 is started when a host device 5 determines to read data from the memory system 1*d*.

As shown in FIG. 29, step ST32 continues to step ST71. As step ST71, the magnetic memory 2*d* acquires provisional read data, the bit string of magnetic wall presence information, and the bit string of magnetization information. Acquisition of provisional read data, the bit string of magnetic wall presence information, and the bit string of magnetization information includes execution of steps ST11, ST12, ST13, ST14, ST15, ST16, ST17, ST18, ST51, ST52, ST53, ST54, ST55, ST56, ST57, and ST58 of the procedure shown in FIG. 28.

The magnetic memory 2*d* transmits, to the memory controller 3*d*, the provisional read data, the bit string of magnetic wall presence information in the magnetic wall presence information latch 37*d*, and the bit string of magnetization information in the magnetization information latch 32*d* (step ST72).

When the provisional read data, the bit string of magnetic wall presence information, and the bit string of magnetization information are received, the memory controller 3*d* performs magnetization solution by using a magnetization solution unit 18*d* (step ST73). Magnetization solution includes execution of steps ST59, ST22, and ST23 of the procedure shown in FIGS. 23 and 24 according to third embodiment. By the magnetization solution, read data can be obtained. Step ST73 continues to step ST35. The succeeding operation including step ST35 is the same as in the third embodiment (FIG. 26).

According to the fourth embodiment, the magnetic memory 2*d* generates provisional read data and magnetization information as in the third embodiment, and the memory controller 3*d* performs magnetization solution to generate read data. Hence, the same advantage as in the third embodiment can be obtained.

Further, according to the fourth embodiment, as in the third embodiment, magnetic wall presence information and magnetization information are accumulated over all the reading target memory cells MC. If error correction on the first received read data in response to a read command fails, error correction on the first received read data is tried based on the bit string of magnetic wall presence information and the bit string of magnetization information. Hence, the same advantage as in the third embodiment can be obtained.

As step ST72, provisional read data and magnetization information alone may be transmitted, and the memory controller 3*d* may acquire the bit string of magnetic wall presence information in the magnetic wall presence information latch 37 from the magnetic memory 2*d* by transmitting a command immediately before step ST64.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A magnetic memory comprising:
a magnetic body extending in a first direction and including portions aligned in the first direction;
a first circuit configured to output first information indicating presence or absence of a magnetic wall between two portions which are adjacent among the portions, and second information based on a combination of magnetization states of the two portions;
a first storage circuit configured to store first bits respectively corresponding to the portions, where a most significant bit of the first bits has a value independent of a magnetization state of its corresponding portion among the portions, and each of the first bits has a value based on the first information;
a second storage circuit configured to store the second information in a second bit; and
a second circuit configured to cause the first storage circuit to output the first bits when a value of a least significant bit of the first bits matches a value of the second information stored in the second storage circuit, and cause the first storage circuit to output third bits having inverse values of the first bits in respective bits when the value of the least significant bit of the first bits is different from the value of the second information stored in the second storage circuit.

2. The memory according to claim 1, wherein each of the first bits has the same value as an adjacent bit aligned on a side of the most significant bit of the first bits when it is determined that a corresponding single portion among the portions and an adjacent portion aligned with the corresponding single portion in the first direction have the same magnetization state, and has a value different from the adjacent bit when it is determined that the corresponding single portion and the adjacent portion have different magnetization states.

3. The memory according to claim 2, wherein every time the first information is received, the first storage circuit shifts a value of each of the first bits to an adjacent bit, and stores a value based on the received first information in the least significant bit of the first bits.

4. The memory according to claim 1, wherein the second information has a first value when a first portion among the portions has a first magnetization state and the first portion, before a magnetic wall in the portions shifts in the first direction, has a second magnetization state, and has a second value when the first portion has the second magnetization state and the first portion, before the shift of the magnetic wall, has the first magnetization state.

5. The memory according to claim 4, wherein the first magnetization state is a state of magnetization toward a second direction, the second magnetization state is a state of magnetization toward a third direction, and the third direction is different from the second direction.

6. The memory according to claim 1, wherein every time a magnetic wall in the portions shifts in the first direction, the first circuit outputs the first information and outputs the second information based on a magnetization state of a first portion among the portions and a magnetization state of the first portion before the shift of the magnetic wall.

7. The memory according to claim 1, wherein every time the second information is received, the second storage circuit updates the value of the second bit with the received second information.

8. The memory according to claim 1, further comprising:
a third storage circuit configured to store fourth bits, wherein every time the first information is received, the third storage circuit shifts a value of each of the fourth bits to an adjacent bit, and stores a value based on the received first information in a least significant bit of the fourth bits, the first information has a third value when it is determined that a magnetic wall exists, the second storage circuit stores fifth bits, every time the second information is received, the second storage circuit shifts a value of each of the fifth bits to an adjacent bit, and stores a value based on the received second information in a least significant bit of the fifth bits, and the second bit is the bit in the same place as a least significant bit of the fourth bits, and has the third value.

9. A memory system comprising:
a memory controller;
a magnetic memory;
a magnetic body extending in a first direction and including portions aligned in the first direction;
a first circuit configured to output first information indicating presence or absence of a magnetic wall between two portions which are adjacent among the portions, and second information based on a combination of magnetization states of the two portions;

a first storage circuit configured to store first bits respectively corresponding to the portions, where a most significant bit of the first bits has a value independent of a magnetization state of its corresponding portion among the portions, and each of the first bits has a value based on the first information;

a second storage circuit configured to store the second information in a second bit; and a second circuit configured to cause the first storage circuit to output the first bits when a value of a least significant bit of the first bits matches a value of the second information stored in the second storage circuit, and cause the first storage circuit to output third bits having inverse values of the first bits in respective bits when the value of the least significant bit of the first bits is different from the value of the second information stored in the second storage circuit.

10. The system according to claim 9, wherein each of the first bits has the same value as an adjacent bit aligned on a side of the most significant bit of the first bits when it is determined that a corresponding single portion among the portions and an adjacent portion aligned with the corresponding single portion in the first direction have the same magnetization state, and has a value different from the adjacent bit when it is determined that the corresponding single portion and the adjacent portion have different magnetization states.

11. The system according to claim 10, wherein
every time the first information is received, the first storage circuit shifts a value of each of the first bits to an adjacent bit, and stores a value based on the received first information in the least significant bit of the first bits.

12. The system according to claim 9, wherein the second information has a first value when a first portion among the portions has a first magnetization state and the first portion, before a magnetic wall in the portions shifts in the first direction, has a second magnetization state, and has a second value when the first portion has the second magnetization state and the first portion, before the shift of the magnetic wall, has the first magnetization state.

13. The system according to claim 12, wherein
the first magnetization state is a state of magnetization toward a second direction,
the second magnetization state is a state of magnetization toward a third direction, and
the third direction is different from the second direction.

14. The system according to claim 9, wherein
every time a magnetic wall in the portions shifts in the first direction, the first circuit outputs the first information and outputs the second information based on a magnetization state of a first portion among the portions and a magnetization state of the first portion before the shift of the magnetic wall.

15. The system according to claim 9, wherein
every time the second information is received, the second storage circuit updates the value of the second bit with the received second information.

16. The system according to claim 9, further comprising:
a third storage circuit configured to store fourth bits, wherein
every time the first information is received, the third storage circuit shifts a value of each of the fourth bits to an adjacent bit, and stores a value based on the received first information in a least significant bit of the fourth bits,
the first information has a third value when it is determined that a magnetic wall exists,
the second storage circuit stores fifth bits,
every time the second information is received, the second storage circuit shifts a value of each of the fifth bits to an adjacent bit, and stores a value based on the received second information in a least significant bit of the fifth bits, and
the second bit is the least significant bit of the fourth bits, and has the third value.

17. The system according to claim 16, wherein
the magnetic memory comprises the magnetic body, the first circuit, the first storage circuit, and the second storage circuit,
the memory controller comprises the second circuit, and
the memory controller receives read data including one of the first bits and the third bits, and causes the magnetic memory to output the fourth bits and the fifth bits when error correction on the read data fails.

18. The system according to claim 16, wherein
the magnetic memory comprises the magnetic body, the first circuit, the first storage circuit, and the second storage circuit,
the memory controller transmits a first command to the magnetic memory, and
when the first command is received, the magnetic memory outputs the first bits, the fourth bits, and the fifth bits.

19. The system according to claim 9, wherein
the magnetic memory comprises the magnetic body, the first circuit, the first storage circuit, the second storage circuit, and the second circuit.

20. The system according to claim 9, wherein
the magnetic memory comprises the magnetic body, the first circuit, the first storage circuit, and the second storage circuit, and
the memory controller comprises the second circuit.

* * * * *